US007396989B2

(12) United States Patent
Kikumoto

(10) Patent No.: US 7,396,989 B2
(45) Date of Patent: Jul. 8, 2008

(54) WAVEFORM GENERATING DEVICE

(75) Inventor: Tadao Kikumoto, Shizuoka (JP)

(73) Assignee: Roland Corporation, Hamamatsu (JP)

( * ) Notice: Subject to any disclaimer, the term of this patent is extended or adjusted under 35 U.S.C. 154(b) by 501 days.

(21) Appl. No.: 10/821,639

(22) Filed: Apr. 9, 2004

(65) Prior Publication Data

US 2005/0081700 A1 Apr. 21, 2005

(51) Int. Cl.
*G10H 7/00* (2006.01)
*G11C 00/00* (2006.01)

(52) U.S. Cl. .......................................... 84/604; 84/612

(58) Field of Classification Search .................. 84/645, 84/604–607, 612
See application file for complete search history.

(56) References Cited

U.S. PATENT DOCUMENTS 5,973,255 A * 10/1999 Tanji .......................... 84/636
6,169,240 B1 * 1/2001 Suzuki ........................ 84/605
6,403,871 B2 * 6/2002 Shimizu et al. ............... 84/622
2001/0025560 A1 * 10/2001 Sato ............................ 84/604

* cited by examiner

*Primary Examiner*—Jeffrey Donels
(74) *Attorney, Agent, or Firm*—Foley & Lardner LLP

(57) ABSTRACT

To compose a series of musical tones, a waveform generating device reads out a plurality of time axis segments of waveform data in optional order by compressing or expanding the segments of waveform data in conformance with performance data. With the waveform generating device of the present invention, first performance data are updated in conformance with tempo alterations of second performance data. Based on the updating, a time compression and expansion percentage of each waveform data segment is derived. In those cases where there have been performance tempo alterations, the waveform data can be generated in conformance with the tempo alterations.

23 Claims, 15 Drawing Sheets

(a)

(b)

| Musical tone number | Time | Note No. | Duration |
|---|---|---|---|
| 1 | 0 | 67 | 60 |
| 2 | 60 | 64 | 60 |
| 3 | 120 | 62 | 60 |
| 4 | 180 | 65 | 60 |
| 5 | 240 | 64 | 240 |
| 6 | 480 | 67 | 60 |
| 7 | 540 | 64 | 60 |
| 8 | 600 | 62 | 60 |
| 9 | 660 | 65 | 60 |
| 10 | 720 | 64 | 120 |
| 11 | 960 | 67 | 60 |
| 12 | 1020 | 64 | 60 |
| 13 | 1080 | 62 | 60 |
| 14 | 1140 | 65 | 60 |
| 15 | 1200 | 64 | 240 |
| 16 | 1440 | 67 | 60 |
| 17 | 1500 | 64 | 60 |
| 18 | 1560 | 62 | 60 |
| 19 | 1620 | 65 | 60 |
| 20 | 1680 | 64 | 120 |
| 21 | 1920 | 67 | 60 |
| ... | ... | ... | ... |

(a)

| Musical tone number | Time | Note No. | Duration |
|---|---|---|---|
| 1 | 3 | 67 | 88 |
| 2 | 94 | 64 | 32 |
| 3 | 127 | 62 | 52 |
| 4 | 208 | 65 | 30 |
| 5 | 243 | 64 | 170 |
| 6 | 484 | 67 | 60 |
| 7 | 570 | 64 | 25 |
| 8 | 600 | 62 | 56 |
| 9 | 690 | 65 | 23 |
| 10 | 720 | 64 | 95 |
| 11 | 960 | 67 | 90 |
| 12 | 1050 | 64 | 33 |
| 13 | 1080 | 62 | 50 |
| 14 | 1170 | 65 | 29 |
| 15 | 1200 | 64 | 208 |
| 16 | 1440 | 67 | 50 |
| 17 | 1530 | 64 | 31 |
| 18 | 1560 | 62 | 52 |
| 19 | 1650 | 65 | 29 |
| 20 | 1680 | 64 | 110 |
| 21 | 1920 | 67 | 82 |
| ... | ... | ... | ... |

(b)

| Musical tone number | Time | Note No. | Duration |
|---|---|---|---|
| 1 | 2 | 67 | 87 |
| 2 | 92 | 64 | 29 |
| 3 | 123 | 62 | 50 |
| 4 | 208 | 65 | 30 |
| 5 | 242 | 64 | 170 |
| 6 | 482 | 67 | 52 |
| 7 | 568 | 64 | 24 |
| 8 | 602 | 62 | 54 |
| 9 | 689 | 65 | 21 |
| 10 | 723 | 64 | 99 |
| 11 | 961 | 67 | 45 |
| 12 | 1031 | 64 | 17 |
| 13 | 1060 | 62 | 47 |
| 14 | 1130 | 65 | 20 |
| 15 | 1160 | 64 | 142 |
| 16 | 1357 | 67 | 54 |
| 17 | 1444 | 64 | 26 |
| 18 | 1483 | 62 | 51 |
| 19 | 1562 | 65 | 23 |
| 20 | 1599 | 64 | 107 |
| 21 | 1837 | 67 | 53 |
| ... | ... | ... | ... |

(c)

Fig. 11

WAVEFORM GENERATING DEVICE

CROSS-REFERENCE TO RELATED APPLICATIONS

This present application relates to Japanese Patent Application No. 2003-356171, filed Oct. 16, 2003, from which priority is claimed, and also to Japanese Patent Application No. 2001-2001-300375, filed Sep. 28, 2001, both of which are incorporated by reference herein.

BACKGROUND

1. Field of the Invention

The present invention relates to a waveform generating device in which a musical tone is reproduced by reading out a plurality of waveform data of separated segments in accordance with performance data and, in particular, to a waveform generating device with which, in those cases where there has been an alteration of the performance tempo during the performance, waveform data may be compressed or expanded on the time axis in real time in conformance with the tempo alteration.

2. Description of Related Art

In conventional waveform generating devices, waveform data that have syllables are stored in the storage means and in those cases where the user implements a reproduction instruction such that one syllable of the waveform data is prolonged, the reproduction time is prolonged in real time by establishing a loop reproduction segment in the end of the waveform data that correspond to the syllable for which the prolongation instruction has been made and carrying out loop reproduction in the waveform generation means. In addition, in those cases where a sound production instruction has been made such that the sound production of one syllable in the waveform data is shortened, the shortening of the reproduction time is carried out in real time by interrupting the reproduction of the syllable that is currently being produced in the waveform generation means and shifting the reproduction position toward the head of the waveform data that correspond to the next syllable.

With such conventional waveform generating devices, if the reproduction instruction is repeated, the reproduction of the appropriate audio phrase is begun and sound production that corresponds to the reproduction instruction time is possible. However, due to the fact that a loop reproduction is done only of the end of the syllable for which a prolongation instruction has been issued, there has been the weakness that the feeling of disorder given to the user is great. In addition, in those cases where a shortening instruction has been issued for a single syllable, since the syllable is reproduced no further than the middle, a musical tone that gives a feeling of disorder is reproduced. In those cases also where a portamento performance is done, since the pitch or volume cannot be altered until the next reproduction instruction (for example, pressing a key) is given, the feeling of disorder imparted to the user has been great.

Our prior art of Japanese Unexamined Patent Application Publication (Kokai) Number Hei 10-260685 (Patent Reference 1) discloses a sound source for compressing or expanding waveform data on the time axis (hereinafter, referred to as an “audio phrase sound source”). The audio phrase sound source disclosed in Patent Reference 1 carries out the compression processing or the expansion processing of the waveform data on the time axis by supplying time compression and expansion percentage information (the information that indicates the percentage that the waveform data are to be compressed or expanded on the time axis) and pitch information as parameters to a DSP (digital signal processor) from a CPU (central processing unit).

FIG. 1 is a conceptual block diagram of the audio phrase sound source disclosed in Patent Reference 1. In accordance with FIG. 1, the audio phrase sound source of Patent Reference 1 is furnished with at least storage means with which the waveform data are stored and waveform generation means (a portion of the DSP) with which the output waveform generation processing is performed based on the time compression and expansion percentage information and the pitch information that are supplied from the CPU for the waveform data that are input from the storage means.

The present invention was devised taking into consideration the above-mentioned prior art. The purpose thereof is to provide a waveform generation device that, when carrying out compression or expansion on a time axis of waveform data that has syllables and that utilizes technology employed in a sound source, can arbitrarily carry out in real time control the compression or expansion on a time axis of waveform data and control of the pitch, as shown in the above-mentioned audio phrase sound source, and makes possible the playback of all syllables so as to not impart a sense of incongruity to a user.

Furthermore, the purpose of the present invention is to provide a waveform generation device devised that, in the case of portamento performance and the like that utilizes technology employed in a sound source, can arbitrarily carry out in real time control the compression or expansion on a time axis of waveform data and control of the pitch, as shown in the above-mentioned audio phrase sound source, and makes possible the commencement of a change of the pitch and volume without waiting for the playback instructions of the next pressed key and the like, so as to not impart a sense of incongruity to a user.

SUMMARY

In order to achieve the above-mentioned purpose, the waveform generation device according to the present invention is devised so that the performance data (hereinafter, called “scheduled performance data”) that indicates the content of the performance that is actually performed by manual operation performance or automatic performance and the like is entered in advance; and when the actual performance has been carried out by manual operation performance or automatic performance, waveform data that have carried out compression, expansion or changes of pitch or volume on the time axis with respect to the waveform data recorded in advance based on the scheduled performance data in accordance with the performance data based on the relevant actual performance are created.

Here, the scheduled performance data, as mentioned above, may be performance data input by the user performing manually and may be performance data input by an automatic performance device and the like carrying out an automatic performance. Furthermore, this scheduled performance data may be appropriately renewed by repeatedly carrying out the scheduled performance actually performed by manual operation performance or automatic performance and the like.

Embodiments of the present invention include a storage means that stores waveform data divided in a series of multiple sections; a performance data input means that inputs performance data; a time compression and expansion percentage acquisition means that acquires the time compression and expansion percentage of each section of waveform data stored in the above-mentioned storage means based on a first series of performance data (scheduled performance data) input by the above-mentioned performance data input means; and a waveform generation means that compresses and expands the waveform data stored in the above-mentioned storage means based on the time compression and expansion percentage of each of the above-mentioned sections acquired by the above-mentioned time compression and expansion percentage acquisition means according to a second series of performance data input by the above-mentioned performance data input means and generates new waveform data.

Furthermore, embodiments of the present invention may include a storage means that has stored waveform data divided into a series of multiple sections; a performance data input means that inputs performance data; a storage means that stores pitch information that corresponds to each section of the first performance data input by the above-mentioned performance data input means; and a pitch control means that changes, based on the pitch information stored in the above-mentioned storage means, the pitch of the sections the pitch of which gradually changes in accordance with the second performance data input by means of the above-mentioned performance data input means.

Furthermore, embodiments of the present invention may include a storage means that has stored waveform data divided into a series of multiple sections; a performance data input means that inputs performance data; a storage means that stores volume information that corresponds to each section of the first performance data input by means of the above-mentioned performance data input means; and a volume control means that changes, based on the volume information stored in the above-mentioned storage means, the volume of the sections the volume of which gradually changes in accordance with the second performance data input by means of the above-mentioned performance data input means.

In embodiments of the present invention described above, the performance data input means inputs performance data created by the user performing manually in real time and performance data created by an automatic performance device and the like carrying out an automatic performance. Consequently, according to embodiments of the present invention described above, by carrying out a manual operation performance as in the scheduled performance data and inputting the performance data created by said manual operation performance in the performance data input means, new waveform data may play back most or all of the syllables according to the performance data based on said manual operation performance can be created.

Furthermore, dealing with the minute differences of the performance data based on said manual operation performance and the scheduled performance data by methods that have been well known for a long time is acceptable. Namely, when a manual operation performance is carried out so that a syllable advances faster than scheduled, rapid attenuation of the waveform data is caused from the time point that the instruction that advances the syllable was received, and waveform data is played back from the front of the next syllable. At this time, if the time from the time point when an instruction that advances a syllable is received until the time of the commencement of the front of the next syllable is within a prescribed time, advancing playback as it is without rapid attenuation and the like processing, and moving to playback of the next syllable is acceptable.

Furthermore, when a manual operation performance is carried out so that a syllable advances slower than scheduled, the last several waves of the waveform data of the previous syllable are repeatedly played back and the instruction that advances to the next syllable is waited for.

BRIEF DESCRIPTION OF THE DRAWINGS

A detailed description of embodiments of the invention will be made with reference to the accompanying drawings, wherein like numerals designate corresponding parts in the several figures.

FIG. 3(*b*) shows conceptually the sound production state in accordance with the target waveform data that are produced by the time compression and expansion of the original waveform data according to an embodiment of the present invention;

FIG. 4(*b*) shows the state of the sound production based on a first performance according to an embodiment of the present invention;

FIG. 4(*c*) shows the state of the sound production in accordance with an automatic performance that is carried out based on planned performance data according to an embodiment of the present invention;

FIG. 4(*d*) shows the state of the sound production in accordance with a manual performance based on planned performance data according to an embodiment of the present invention;

FIG. 5(*b*) shows one example of the error processing in those cases where the time period from the time that the sound production instruction for the next waveform segment has been input to the scheduled start time of the beginning of the next waveform segment in the planned performance data is the jump limit segment or less according to an embodiment of the present invention;

FIG. 6(*b*) shows one example of the case in which the reproduction time for a waveform segment during the current performance, in those cases where the manual performance is one in which the waveform segments advance later than the planned performance data, exceeds the scheduled reproduction time in the planned performance data and the sound production instruction for the next waveform segment has not been made after a specified period of time according to an embodiment of the present invention;

FIG. 6(*c*) shows one example of the case in which the reproduction time for a waveform segment during the current performance, in those cases where the manual performance is carried out with the waveform segments advancing later than the planned performance data, exceeds the scheduled reproduction time in the planned performance data and the sound production instruction for the next waveform segment has been made within a specified period of time according to an embodiment of the present invention;

FIG. 7(*b*) is a flowchart of the key pressing interrupt processing routine according to another embodiment of the present invention;

FIG. 10(*b*) shows performance data have been expressed by a musical score that expresses the performance data that are made the target according to an embodiment of the present invention;

FIG. 11(*a*) shows original performance data expressed in accordance with the musical score that is shown in FIG. 10(*a*) according to an embodiment of the present invention;

FIG. 11(*b*) shows the performance data of the first performance that have been stored in a specified storage region according to an embodiment of the present invention;

FIG. 11(*c*) shows the first performance data of FIG. 11(*b*) that are made the planned performance data and shows the performance data of the second performance that has been carried out anew following the first performance according to an embodiment of the present invention;

FIG. 13(*b*) shows the pitch alteration in those cases where the first performance has been carried out for the original waveform data according to an embodiment of the present invention;

FIG. 13(*c*) shows the pitch alteration in those cases where the second performance has been carried out while referring to the planned performance data based on the first performance data according to an embodiment of the present invention;

FIG. 14(*b*) shows the volume alteration in those cases where the first performance has been carried out for the original waveform data according to an embodiment of the present invention;

FIG. 14(*c*) shows the volume alteration in those cases where the second performance has been carried out while referring to the planned performance data based on the first performance data according to an embodiment of the present invention;

FIG. 15(*b*) shows the volume alteration in those cases where the second performance has been carried out while referring to the planned performance data based on the first performance data according to an embodiment of the present invention.

DETAILED DESCRIPTION

In the following description of preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the preferred embodiments of the present invention.

Figure 1:
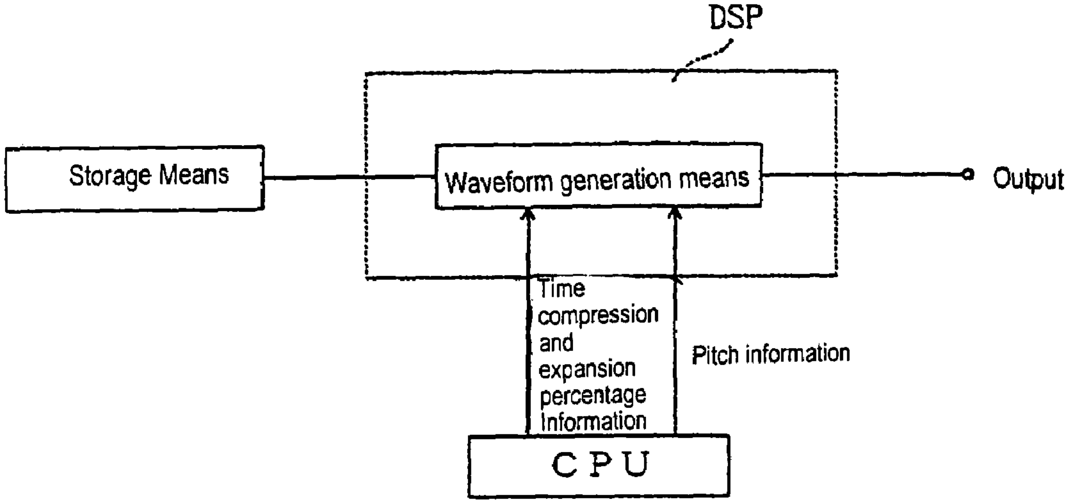
FIG. 1 is a block drawing that shows conceptually the structure of the audio phrase sound source that is disclosed in the prior art.
Figure 2:
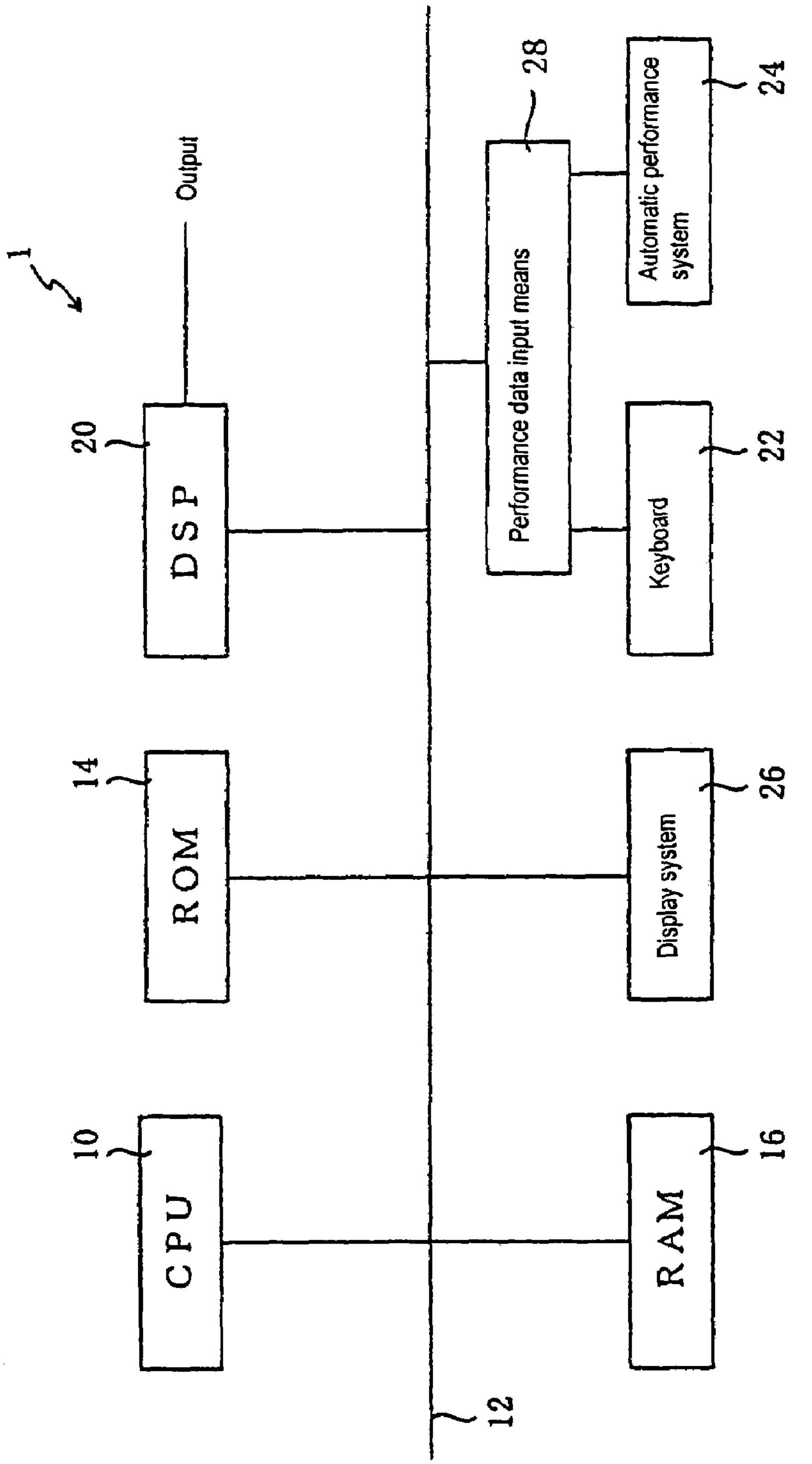
FIG. 2 is a block drawing that shows conceptually the structure of the waveform generating device of the present invention according to an embodiment of the present invention.

Below, one embodiment of the waveform generation device according to the present invention will be explained in detail, referring to the attached drawings. FIG. 2 is a block drawing that shows the configuration of the waveform generating device 1 of the present invention in outline.

The waveform generating device 1 primarily has the CPU 10, the ROM 14, the RAM 16, the DSP 20, the performance data input means 28, the bus 12 with which these are structurally interconnected, the key board 22 that is connected to the performance data input means 28 and which is for the input of the performance data to the waveform generating device 1, and the automatic performance system 24 installed.

Figure 7:
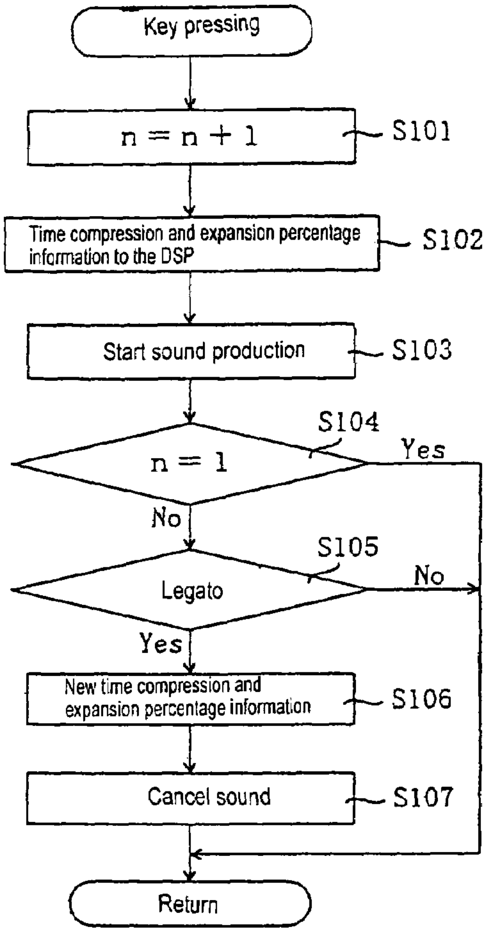
FIG. 7(*a*) is a flowchart of the key pressing time interrupt processing routine that is executed by the CPU according to an embodiment of the present invention.
Figure 7:
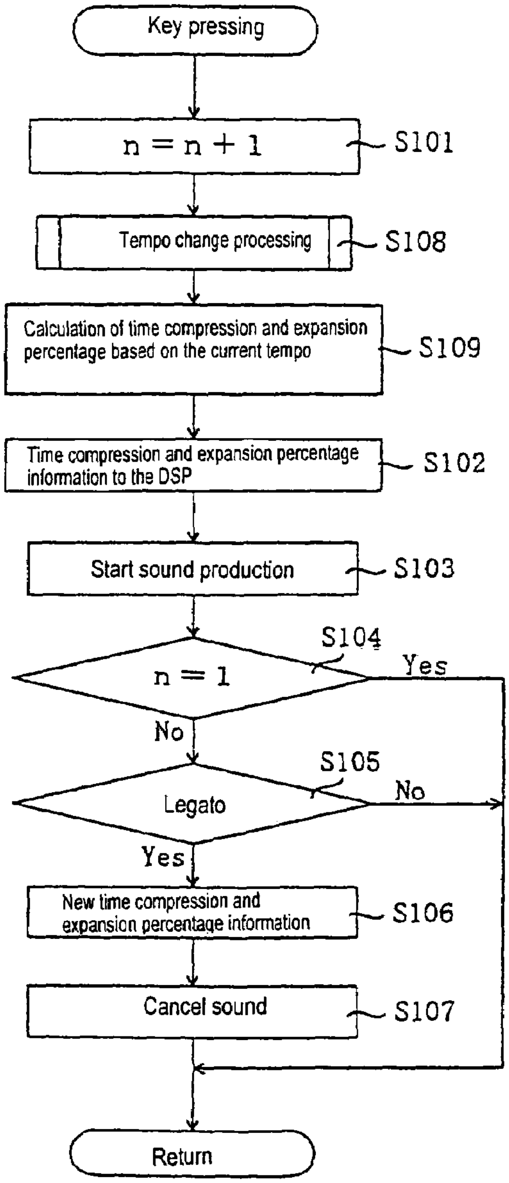
Figure 8:
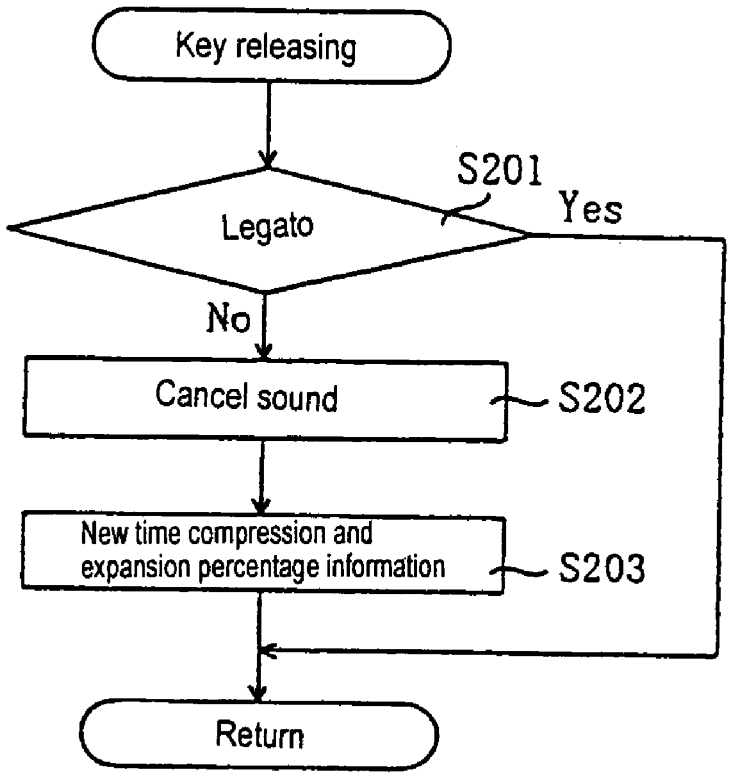
FIG. 8 is a flowchart of the key releasing time interrupt processing routine that is executed by the CPU according to an embodiment of the present invention.
Figure 12:
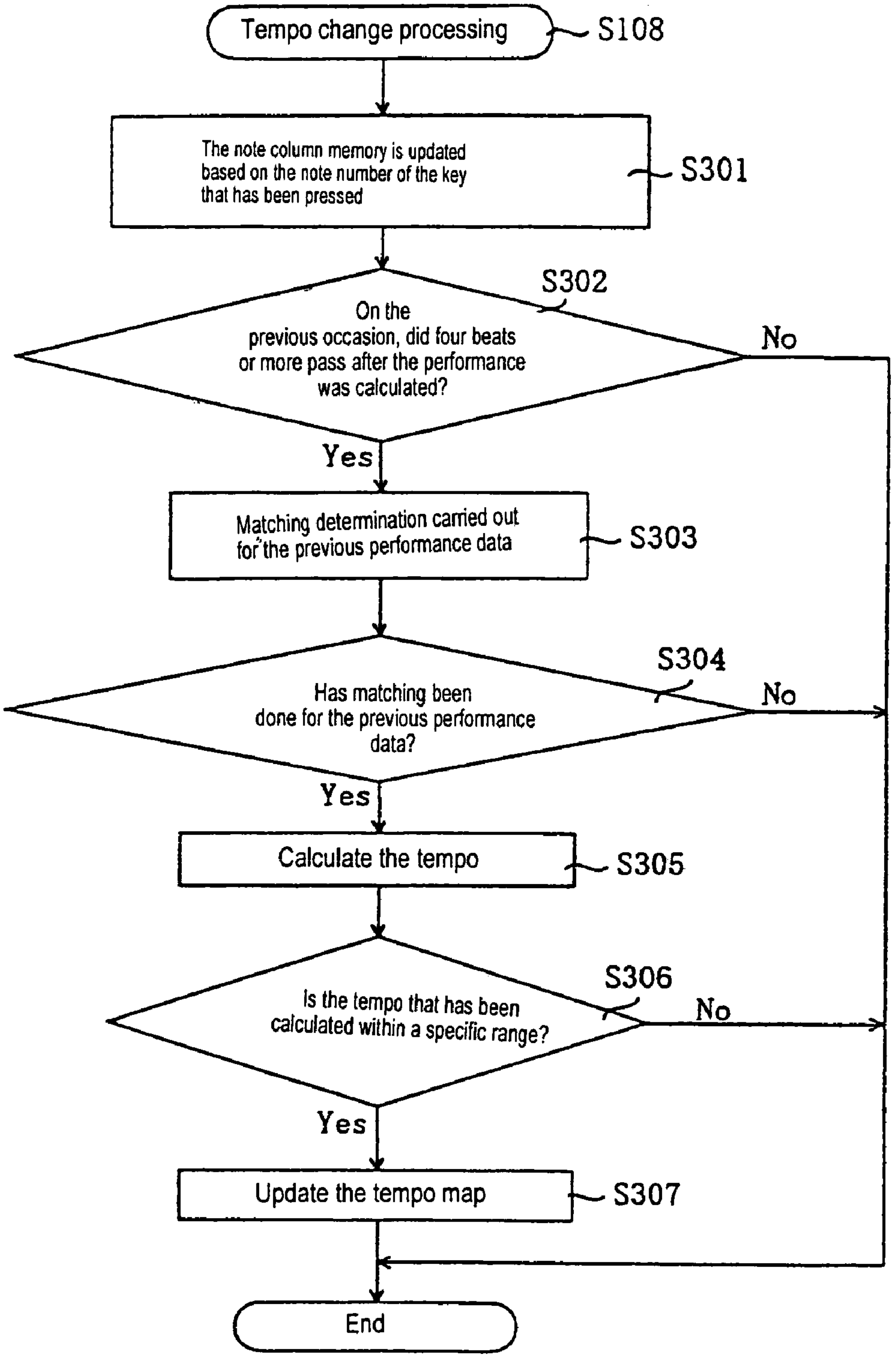
FIG. 12 is a flowchart of the tempo change processing routine that is executed by the CPU according to an embodiment of the present invention.

The CPU 10 is a central processing unit that controls the waveform generating device 1 overall. The control of the processing that is shown in the flowcharts of FIG. 7, FIG. 8, and FIG. 12, which will be discussed later, is carried out by the CPU 10. The various kinds of control programs that are executed by the CPU 10 and the fixed value data that are referred to at the time of the execution are stored in the ROM (read only memory) 14.

The RAM (random access memory) 16 is a rewritable memory that can be accessed as needed and having various kinds of registers that are required for the execution of the control programs that are stored in the ROM 14, a working area in which various kinds of buffers and the like are established, a temporary area in which the data are stored temporarily during processing, a storage region in which the performance data that have been input from the keyboard 22 and their performance data are stored, a storage region in which time compression and expansion percentage information and pitch information and the like that have been acquired due to the control of the CPU 10 are stored, and the like. Incidentally, in the performance data are included, for example, information related to the key pressing and key releasing such as note on and note off, the time information for the note on or the note off, tempo information that includes a tempo map, which are data that describe the progress of the musical composition and the tempo alterations, as well as time compression and expansion percentage information and the like.

The DSP 20 is a functional device for the operational processing of the waveform data of the digital signal and contains a program data memory in which the control programs for the operational processing and the like are stored, a working memory that is used at the time of the execution of the control programs, and the like. In addition, the DSP 20 is furnished with the same structure as the DSP that is installed in the audio phrase sound source that is disclosed in Japanese Unexamined Patent Application Publication (Kokai) Number Hei 10-260685. In other words, the waveform data of a plurality of segments that are stored in the storage means are read out to the DSP 20, time compression and expansion or pitch change is performed on the waveform data that have been read out based on the time compression and expansion percentage information or the pitch information that is supplied by the CPU 10, and the data are output from the DSP 20 by the waveform generation means.

The waveform generating device 1 performs time compression and expansion or pitch change as required on the original waveform data in accordance with the performance data that have been input from the keyboard 22 and the automatic performance system 24, and generates the waveform intended by the user (hereinafter, referred to as the "target waveform data").

Figure 3:
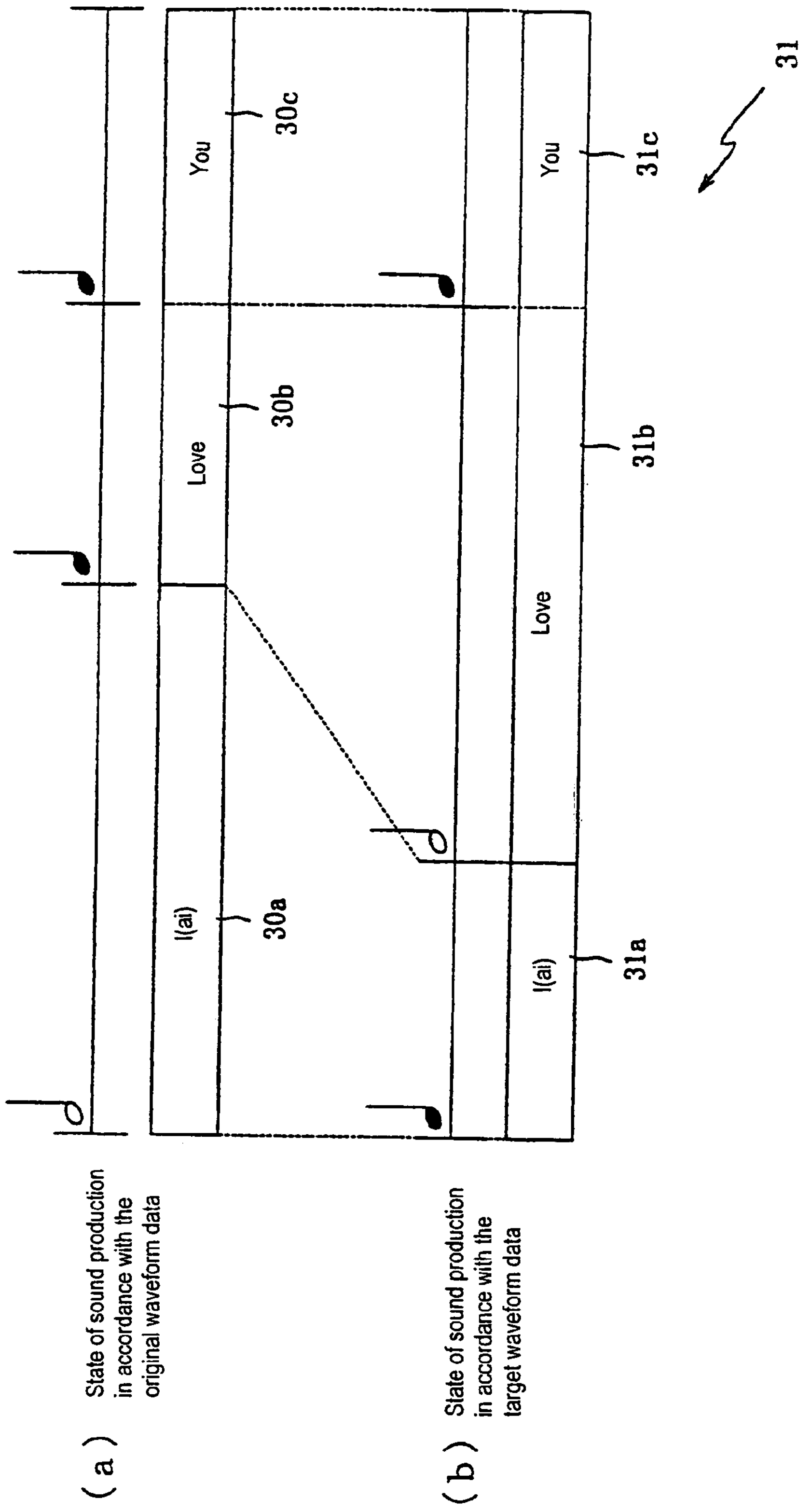
FIG. 3(*a*) shows conceptually the original waveform data and the original performance data that correspond to them according to an embodiment of the present invention.

Next, a conceptual explanation will be given regarding the original waveform data 30 and the target waveform data 31 that are generated by the time compression and expansion of the original waveform data 30 while referring to FIG. 3. FIG. 3(*a*) is a drawing that shows conceptually the sound production state using the original waveform data 30, and FIG. 3(*b*) is a drawing that shows conceptually the sound production state using the target waveform data 31 that have been generated by the time compression and expansion of the original waveform data 30. Incidentally, in FIG. 3, in order to make the understanding of the present invention easy, it has been arranged as the case in which the target waveform data 31 are generated from the original waveform data with no pitch alteration.

FIG. 3(*a*) shows the provision of the waveform segments 30*a* through 30*c*, which may be separated sound components or may be a chain of a plurality of separated sound components, in which the waveform data 30 has been delimited into three and the first waveform segment 30*a* is the length of a half note and produces the sound "ai [I]," the second waveform segment 30*b* is the length of a quarter note and produces the sound "love," and the third waveform segment 30*c* is the length of a quarter note and produces the sound "you."

On the other hand, FIG. 3(*b*) shows conceptually the target waveform data 31 that are the form of the sound production that is the target. Here, for the first waveform segment 31*a*, the target has been made the production of the sound "ai" and not "a" in the sound production length of a quarter note, which is one-half the first waveform segment 30*a*. In addition, for the second waveform segment 31*b*, the production of the sound "love" is made in the length of a half note, which is double the length of the second waveform segment 30*b*, and the target has been made the production of the sound "love" temporally uniformly in the second waveform segment 30*b* and not the mechanical expansion of the sound of "ve," which cannot be expanded, producing "love— (where "—" is noise), and not making the sound production of the second waveform segment 30*b* insufficient, not expanding the sound "ve," which cannot be expanded.

Figure 4:
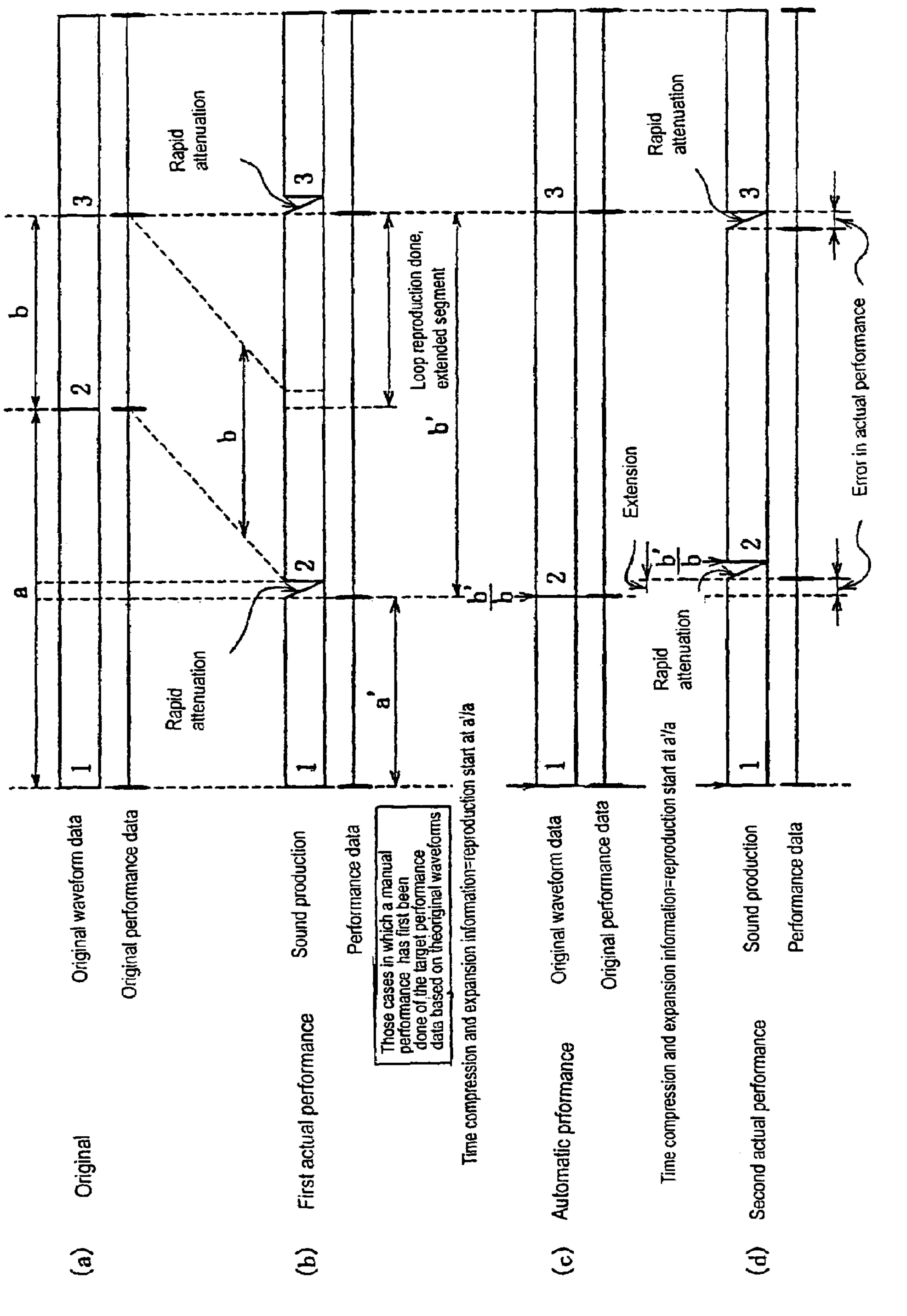
FIG. 4(*a*) shows the state of the sound production in accordance with original waveform data according to an embodiment of the present invention.

Next, a concrete explanation will be given regarding the operation of a first preferred embodiment of the waveform generating device 1 of the present invention while referring to FIG. 4. Incidentally, in FIG. 4, in order to make the understanding of the present invention easy, pitch alteration is not exhibited. In the first preferred embodiment, for the original waveform data that are shown in FIG. 4(*a*), a plurality of waveform segments are time compressed and expanded respective compression and expansion percentages and, in order to obtain the target sound production state, the same contents are performed twice. In this case, the first performance data are stored as the performance data that are scheduled for the next sound production state, the first performance data are used for the calculation of the time compression and expansion percentage information of each waveform segment at the time of the second performance, and the target sound production state is achieved. Here, the performance data that are scheduled for the next sound production state and stored are referred to as the "planned performance data."

FIG. 4(*b*) is the first performance that has been carried out for the original waveform data of FIG. 4(*a*), in other words, this is a drawing that shows the sound production state at the time that the performance data that are shown in FIG. 4(*a*) have been input. In this preferred embodiment, the user carries out a key pressing or key releasing operation of the keyboard 22 and a manual performance is done as the first performance such that each of the reproduction time lengths for the first waveform segment (segment 1), the second waveform segment (segment 2), and the third waveform segment (segment 3) become the same time lengths as for the target sound production state.

In the first performance, when one key that is contained in the keyboard 22 is pressed, the sound production of the first waveform segment is started at a pitch that conforms to the key that has been pressed and when another key is pressed after the passage of the time a', the sound production of the second waveform segment is started at the pitch of the other key. By this means, at the time that the keys that comprise the keyboard 22 are pressed, the reproduction of one waveform segment shifts to the next waveform segment. Incidentally, at the time of the first performance, for all of the first waveform segment, the second waveform segment, and the third waveform segment, the time compression and expansion percentage information is read out as "1," indicating that the waveform data from the original performance data of FIG. 4(*a*) that correspond to the original waveform data of FIG. 4(*a*) and have been stored before are neither compressed nor expanded, and output to the DSP 20 from the CPU.

As a result, as is shown in FIG. 4(*b*), since the sound production of the first waveform segment has been started by the first key pressing and the second key pressing has been done at the point in time where the time a' has passed, the reproduction of the first waveform segment of the original waveform data of FIG. 4(*a*) rapidly attenuates from the reproduction time a' time point and the waveform after the time a' is not reproduced. Therefore, since at the point in time where the reproduction of about one half of the first waveform segment of the original waveform data of FIG. 4(*a*) has been carried out, the sound production instruction for the following second waveform segment has been given, no more than the sound production of "a-" is done of the first waveform segment "ai" of the original waveform data of FIG. 4(*a*).

In addition, since the length of the second waveform segment in the first performance becomes about twice the length of the second waveform segment of the original waveform data, in those cases where a specified loop-segment is established near the end point of the second waveform segment in the original waveform data of FIG. 4(*a*), after the reproduction has progressed up to the loop segment, the loop segment is repeated and reproduced as it is. Then, when the sound production instruction is given for the next third waveform segment, the sound production of the second waveform segment rapidly attenuates and the sound production of the third waveform segment starts. Or, in those cases where a specified loop segment has not been established near the end point of the second waveform segment in the original waveform data of FIG. 4(*a*), the reproduction of the second waveform segment is done at the original length and the sound is dampened at the end, the system stands by silently as it, is, and next, a sound production instruction for the third waveform segment is given and the sound production of the third waveform segment starts.

The first performance is stored as the planned performance data. The times a', b', . . . that have been measured as the reproduction times (the performance times) of each segment may be stored in the planned performance data and the key pressing and key releasing time stored for each key, or the times a', b', . . . that have been obtained by calculating the time from the pressing of one key until that key is released or, in the case of a legato performance, the time from the pressing of one key until the pressing of the next key may be stored.

By referring to the planned performance data that have been stored based on the first performance, in the second performance, the waveform data are reproduced while being compressed and expanded on the time axis in accordance with the performance data of the second performance that are input in turn (the performance progresses). Specifically, when there is a reproduction instruction for the first waveform segment (a reproduction instruction by means of pressing the keys of the keyboard 22 and automatic performance data), first, the CPU 10 outputs the pitch information and the time compression and expansion information a'/a based on the reproduction instruction to the DSP 20. In the DSP 20, the musical tone of the pitch that is instructed by the pitch information that has been input from the CPU 10 is compressed or expanded in conformance with the time compression and expansion information that has been input from the CPU 10 in the same manner and the reproduction is started. Then, when the next key pressing is detected, the DSP 20 discontinues the reproduction of the waveform of the current waveform segment (the first waveform segment) by means of a rapid attenuation and the reproduction for the waveform of the next waveform segment (the second waveform segment) is started in accordance with the pitch information and the time compression and expansion information (b'/b) based on the reproduction instruction that is input from the CPU 10. Here, in those cases where the point of the waveform of the current waveform segment (the first waveform segment) that is read out has entered a loop segment prior to the detection of the next key pressing, the specified loop segment is repeated and read out until the next reproduction instruction is made and the reproduction is extended. Or else, in those cases where a loop segment has not been set for the current waveform segment, when the readout of the waveform of the waveform segment ends, the system stands by for the next reproduction instruction.

In the first performance, since the length of each segment of the original performance data that correspond to the original waveform data and the length of each segment of the performance data that have been input by means of a manual input and the like are greatly different, the sound of "i" in the "ai" that should properly be produced based on the first waveform segment is not produced or in the case of "love" that should properly be produced based on the second waveform segment, the "ve" cannot be expanded to the sound "ve-." Because of this, the sound is not expanded and the sound production time is shorter than the length of the sound production that has been instructed by the performance, or by a forced expansion, the sound production is done with noise as "love— (the "—" is noise)" and an unnaturalness occurs in the sound production. However, in those cases where a performance with the same contents is carried out twice, at the time of the second performance, if the reproduction is done while the time compression and expansion information for each segment that has been obtained from the first performance is used and the waveform data are time compressed and expanded, it is possible to eliminate the unnaturalness of the performance such as that discussed above.

On the other hand, in those cases where there is a large difference between the first performance data and the second performance data, due to the same reason as the reason that was mentioned above for the first performance, an unnaturalness occurs in the musical tone that is produced. However, in those cases where a performance target in which how the musical tone is to be produced is decided on, by continuing the performance data that correspond to the performance target using a manual operation and inputting twice, it is possible to reproduce the production of the musical tone without a feeling of disorder in accordance with the performance target at the time of the second performance. In other words, since by means of the first performance, the performance data (the planned performance data), in which the sound production length for each respective waveform segment becomes the target sound production length, are stored, at the time of the second performance, it is possible to make the sound production length of each of the wavelength segments a length that conforms to the time compression and expansion percentage information of each respective waveform segment that has been acquired from the planned performance data that have been stored before.

Accordingly, after the performance target has been decided on, when the second performance is carried out, there are absolutely no errors in those cases where the second performance is an automatic performance (refer to FIG. 4(*c*)) and, in addition, even in those cases where there is a manual performance, since the reproduction of the sound production can be done with only minute errors (refer to FIG. 4(*d*)), it is possible to reproduce the sound production in accordance with the performance target with no feeling of disorder.

Figure 5:
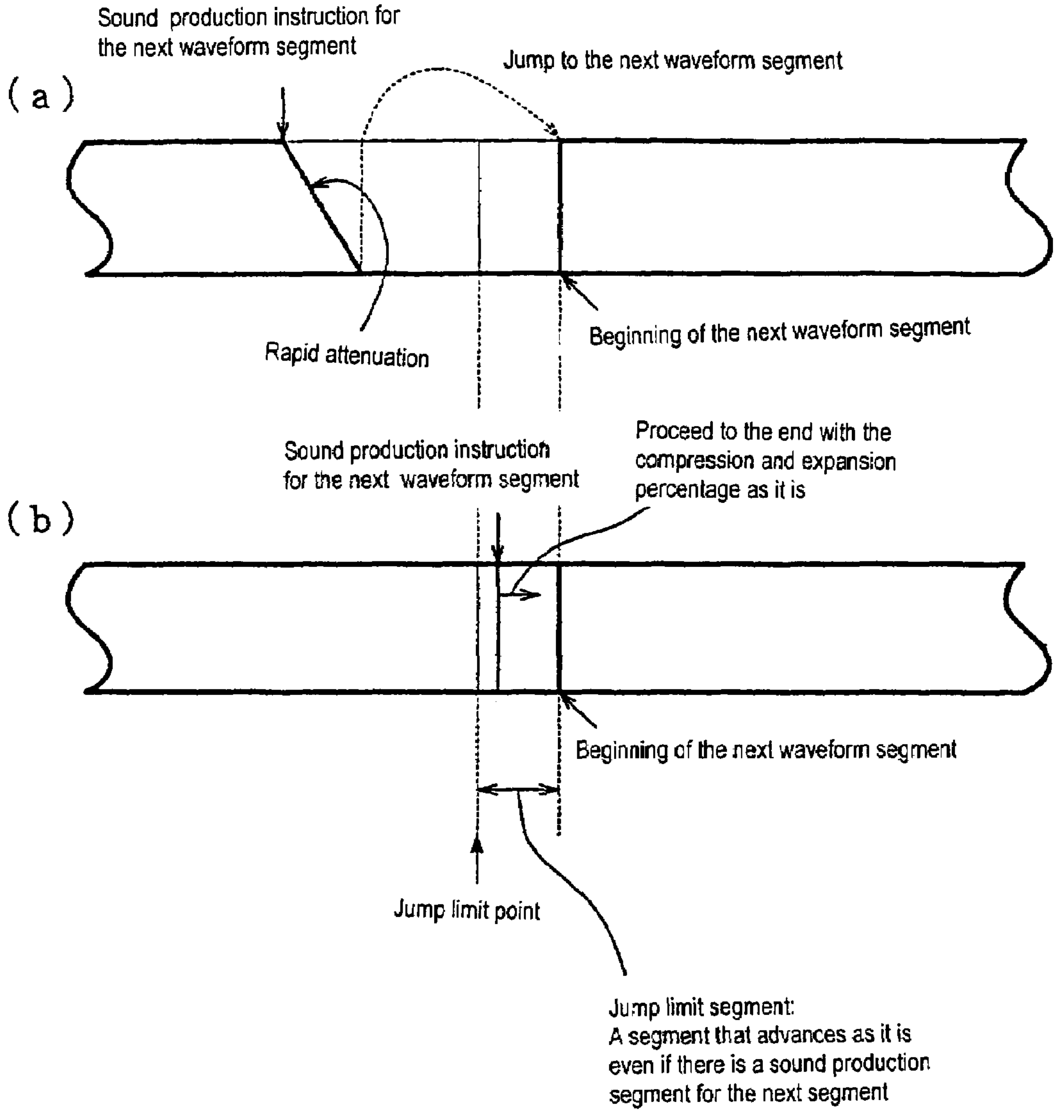
FIG. 5(*a*) shows one example of the error processing in those cases where the time period from the time that the sound production instruction for the next waveform segment has been input to the scheduled start time of the beginning of the next waveform segment in the planned performance data exceeds the jump limit segment according to an embodiment of the present invention.

The subtle errors between the planned performance data that have been stored by the first performance and the performance data from the second performance that has been carried out with the same performance contents can be dealt with by means of publicly known techniques and the like that have been used for some time. FIG. 5 is a drawing for the explanation of an example of error processing in those cases where a manual performance (the second performance) has been carried out such that the waveform segment advances minutely earlier than the planned performance data. FIG. 5(*a*) is a drawing for the explanation of an example of error processing in those cases where the time period from the time at which the instruction that advances the waveform segment (the instruction for the sound production of the next waveform segment) has been input until the scheduled start time of the beginning of the next waveform segment in the planned waveform data exceeds the specified time period (the jump limit segment). In this case, the sound production of the waveform data in the current sound production is rapidly attenuated from the point in time that the sound production instruction for the next segment has been input and then, the reproduction of the waveform data from the beginning of the next waveform segment is started.

In addition, FIG. 5(*b*) is a drawing for the explanation of an example of error processing in those cases where the time period from the time at which the instruction that advances the waveform segment (the instruction for the sound production of the next waveform segment) has been input until the scheduled start time of the beginning of the next waveform segment in the planned waveform data is less than the specified time period (the jump limit segment). In this case, there is no rapid attenuation even if the sound production instruction for the next waveform segment is made, the reproduction progresses maintaining the current time compression and expansion percentage as it is, and the reproduction of the waveform data of the next waveform segment starts when the beginning of the next waveform segment has been reached.

Figure 6:
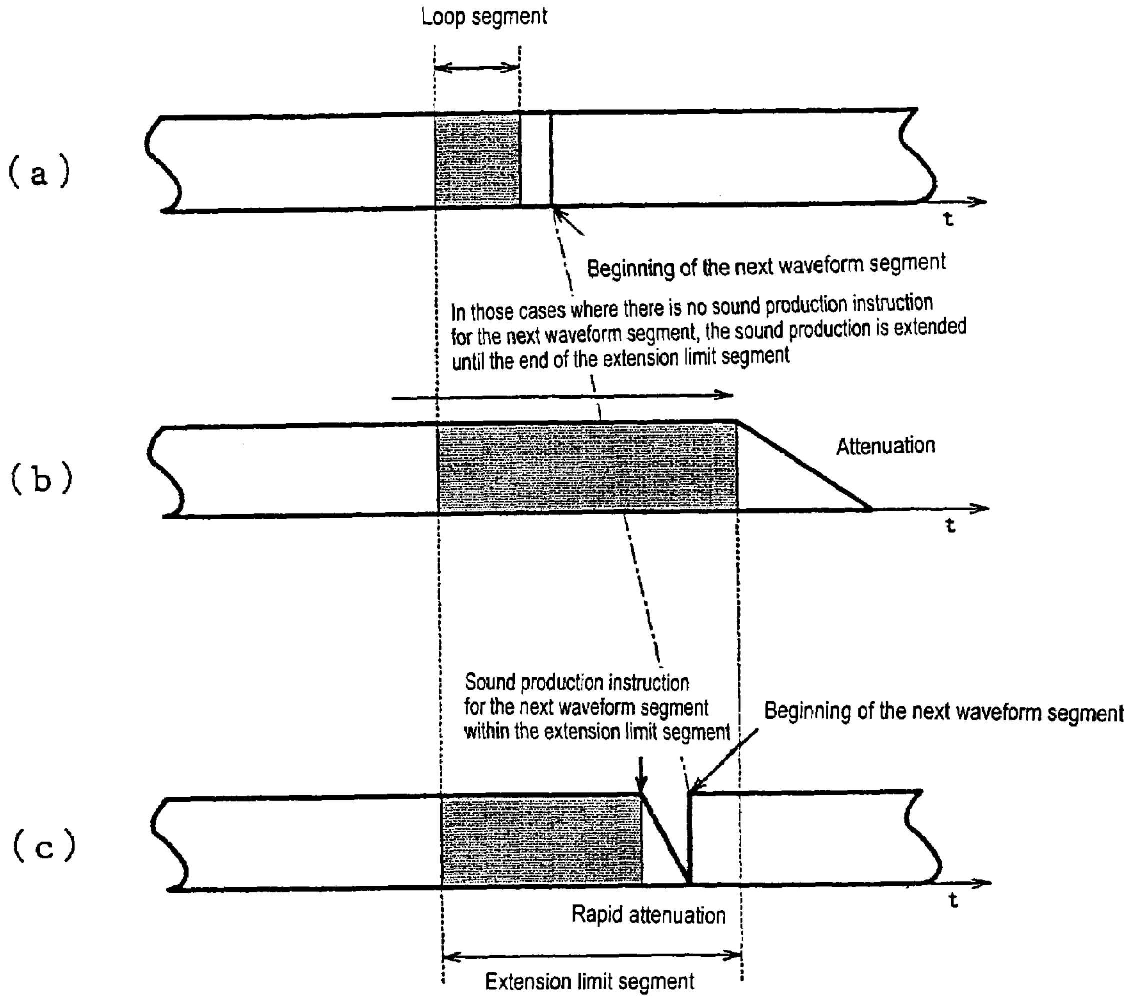
FIG. 6(*a*) shows the situation in those cases where a loop segment of a specified length has been provided near the end point of a waveform segment during the current sound production of the planned performance data for the original waveform data according to an embodiment of the present invention.

On the other hand, FIG. 6 is a drawing for the explanation of the error processing in those cases where a manual performance (the second performance) has been carried out such that the waveform segment advances minutely slower than the planned performance data. FIG. 6(*a*) is a drawing that shows the situation in those cases where a loop segment of a specified length has been established in the original waveform data near the end point of the waveform segment in the current sound production in the planned performance data. The reproduction point in the loop segment that has been established near the end point of the waveform segment in the current performance advances and the loop reproduction is done. Even if the reproduction time period of the waveform segment in the current performance exceeds the scheduled reproduction time period in the planned performance data, in those cases where the next sound production instruction has not been made, a number of waveforms that are contained in the loop segment that is shown in FIG. 6(*a*) are repeated and reproduced and the system stands by for the sound production instruction for the next waveform segment.

FIG. 6(*b*) is a drawing that shows an example of the processing in those cases where the reproduction time period for the waveform segment in the current performance exceeds the scheduled reproduction time in the planned performance data and is greater than the specified time period (the extension limit), which is the case where a manual performance that advances the waveform segment is slower than the planned performance data, and the sound production instruction for the next waveform segment has not been made. In this case, at the point in time that the end of the extension limit segment is reached, the sound production of the waveform data of the segment in the reproduction is attenuated and the reproduction is terminated.

FIG. 6(*c*) is a drawing that shows an example of the processing in those cases where the reproduction time period for the waveform segment in the current performance exceeds the scheduled reproduction time in the planned performance data and is within the specified time period (the extension limit), which is the case where there is a manual performance that advances the waveform segment slower than the planned performance data, and the sound production instruction for the next waveform segment has been made. In this case, at the point in time that the sound production instruction for the next waveform segment is made, the sound production of the waveform data of the segment in the reproduction is rapidly attenuated and the sound production from the beginning of the next waveform segment starts.

Next an explanation will be given regarding the time sequential processing operations that are executed in the waveform generating device 1 while referring to the flowcharts of FIG. 7 and FIG. 8. In the following explanation in order to simplify the explanation and make the understanding of the invention easier, it will be set up such that the waveform generating device 1 will carry out the sound production only of a single sound in the monophony mode and the performance data will be input based on the key pressing or key releasing operation of the keyboard 22.

The processing routines that are shown in FIG. 7 and FIG. 8 are ones that are executed in common whether it is the first performance or the xth performance. Prior to the start of the first performance, since the performance data that are stored are the original performance data, the time compression and expansion percentage information becomes "1" for all of the waveform segment. In addition, at the point in time that the performance is started in which the reproduction from the beginning of the waveform data is done, the segment counter n that specifies the waveform segment is initialized to "0."

In the first preferred embodiment, at the time that a key of the keyboard 22 is pressed, the waveform segments shift successively. In other words, when a key of the keyboard 22 is pressed, the waveform segment with which the performance is started by the key pressing is started with the sound production at a pitch that corresponds to the key that has been pressed and next, when the key that has been pressed is released, the sound production of the waveform data of the segment in the current performance is halted. Then, when the next key of the keyboard 22 is pressed, the sound production of the next waveform segment is started.

In those cases where a new key has been pressed before the key that was pressed first is released (hereinafter, this kind of performance is referred to as a "legato performance"), the sound production based on the waveform segment that corresponds to the key that was pressed first is halted and the sound production based on the next waveform segment is started.

FIG. 7(*a*) is a flowchart of the key pressing time interrupt processing routine of the first preferred embodiment that is executed by the CPU 10. The key pressing time interrupt processing routine program is launched by the pressing of a key of the keyboard 22, or by the inputting of performance data key pressing information. When the key pressing time interrupt processing routine is launched by the pressing of a key of the keyboard 22, first the segment counter n is advanced "1" based on the new key pressing and the next waveform segment is designated (S101).

After the processing of S101, the time compression and expansion percentage information that corresponds to the segment counter n of the performance data that have already been stored in a specified storage region (such as the RAM 16 and the like), the pitch information that is input in accordance with the keyboard 22, and the velocity value are input to the DSP 20 (S102) and an instruction is issued to the DSP 20 to start the sound production (S103).

After the processing of S103, whether the segment counter n is "1" or not, in other words, whether the key pressing is the first key pressing or not, is ascertained (S104). If the result that has been ascertained by the processing of S104 is that it is the first key pressing (S104: yes), the key pressing time interrupt processing routine ends and the processing returns to the main processing routine (not shown in the drawing) of the waveform generating device 1.

On the other hand, if the result that has been ascertained by the processing of S104 is that it is not the first key pressing (S104: no), whether it is a legato performance or not, in other words, whether the key that has been pressed on this occasion has been pressed before the key that was pressed on the previous occasion was released or not, is ascertained (S105). If the result that has been ascertained by the processing of S105 is that it is not a legato performance (S105: no), the key pressing time interrupt processing routine ends and the processing returns to the main processing routine of the waveform generating device 1.

On the other hand, if the result that has been ascertained by the processing of S105 is that it is a legato performance (S105: yes), the time from the key pressing on the previous occasion to the key pressing on this occasion is derived, new time compression and expansion percentage information is calculated based on that, and the time compression and expansion percentage information that has been obtained from the calculation is stored in a specified memory region (for example, the RAM 16) with the performance data that include the tempo map for the performance on this occasion (S106). After the processing of S106, the sound production of the waveform segment that had been produced by the key pressing of the previous occasion is canceled (S107), the key pressing time interrupt processing routine ends, and the processing returns to the main processing routine of the waveform generating device 1.

An explanation will be given next regarding the key releasing time interrupt processing routine that is executed by the CPU 10 while referring to the flowchart of FIG. 8. The key releasing time interrupt processing routine program is launched by the releasing of a key of the keyboard 22, or by the inputting of performance data key releasing information. When the key releasing time interrupt processing routine is launched by the releasing of a key of the keyboard 22, first whether it is a legato performance or not, in other words, whether at the point in time that key that has been released on this occasion, is one at which another key was pressed or not, is ascertained (S201). If the result that has been ascertained by the processing of S201 is that it is a legato performance (S201: yes), the key releasing time interrupt processing routine ends and the processing returns to the main processing routine (not shown in the drawing) of the waveform generating device 1.

On the other hand, if the result that has been ascertained by the processing of S201 is that it is not a legato performance (S201: no), the musical tone that is being produced based on the pressing of the key that has been released on this occasion (the key that was pressed on the previous occasion) is canceled (S202). After the processing of S202, the difference between the key pressing time of the previous occasion and the key releasing time (the key pressing time period) is derived, new time compression and expansion percentage information is calculated based on the key pressing time period, the time compression and expansion percentage information that has been calculated and the performance data that include the tempo map for the performance of this occasion are stored in a specified storage region (for example, the RAM 16; S203), the key releasing time interrupt processing routine ends, and the processing returns to the main processing routine of the waveform generating device 1.

Figure 9:
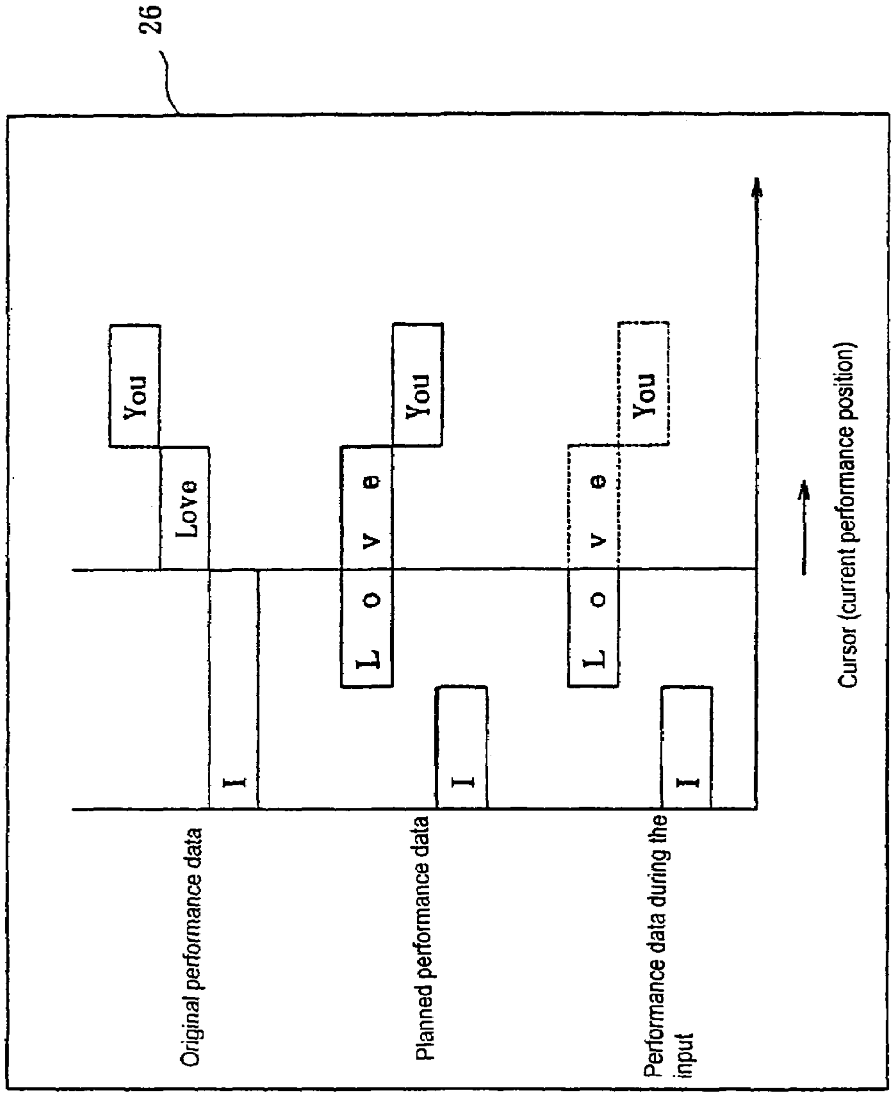
FIG. 9 shows the display details that are displayed by the display system during the input of the performance data done by an automatic performance or during the input of performance data based on the key pressing or key releasing operation of the keyboard according to an embodiment of the present invention.

Here, FIG. 9 is a drawing that shows the display that is displayed by the display system 26 during the input of the performance data that are produced by an automatic performance or during the input of the performance data based on the key pressing or key releasing operation of the keyboard 22. As is shown in FIG. 9, the display system 26 displays the pitch and sound production length of each waveform segment that is defined by the performance data that have been input by the operation of the keyboard 22 and the like and reproduced from one minute to the next from the point at which the reproduction of the waveform data is started until the current reproduction point is reached. In addition, with regard to what comes after the current reproduction point, the planned performance data are referred to and the pitch and sound production length of each waveform segment are displayed in a display form that is different from the display form up to that point.

As discussed above, in the first preferred embodiment of the waveform generating device 1 of the present invention, the planned performance data based on the first performance are stored in a specified memory region (such as the RAM 16 and the like) in a form in which the time compression and expansion percentage information for each of the waveform segments that has been acquired from the planned performance data is included. Thus, it is possible to avoid an unnaturalness when the planned performance data (in other words, the first performance data) are referred to and the second performance is carried out.

Next, an explanation will be given regarding a second preferred embodiment of the waveform generating device 1 of the present invention while referring to FIG. 10 and FIG. 11 and the flowcharts of FIG. 7(*b*) and FIG. 12. In the first preferred embodiment described above, when the second performance is carried out, the compression and expansion of the waveform data is done for each segment of the original waveform data based on the time compression and expansion percentage information that has been acquired from the first performance. In contrast to this, with the second preferred embodiment, in the second performance, together with the compression and expansion of the waveform data based on the time compression and expansion information of the performance data that have been stored with the first performance, when a disparity is detected between the performance tempo of the second performance and the performance tempo of the first performance, the tempo map of the performance data that has been stored in a specified storage region is updated at the point in time of the detection and the compression and expansion of the waveform data on the time axis is carried out based on the new tempo that corresponds to the updated tempo map. The tempo map here is the data that describe the progression of the musical composition and the alterations in the tempo and is stored as planned performance data.

Figure 10:
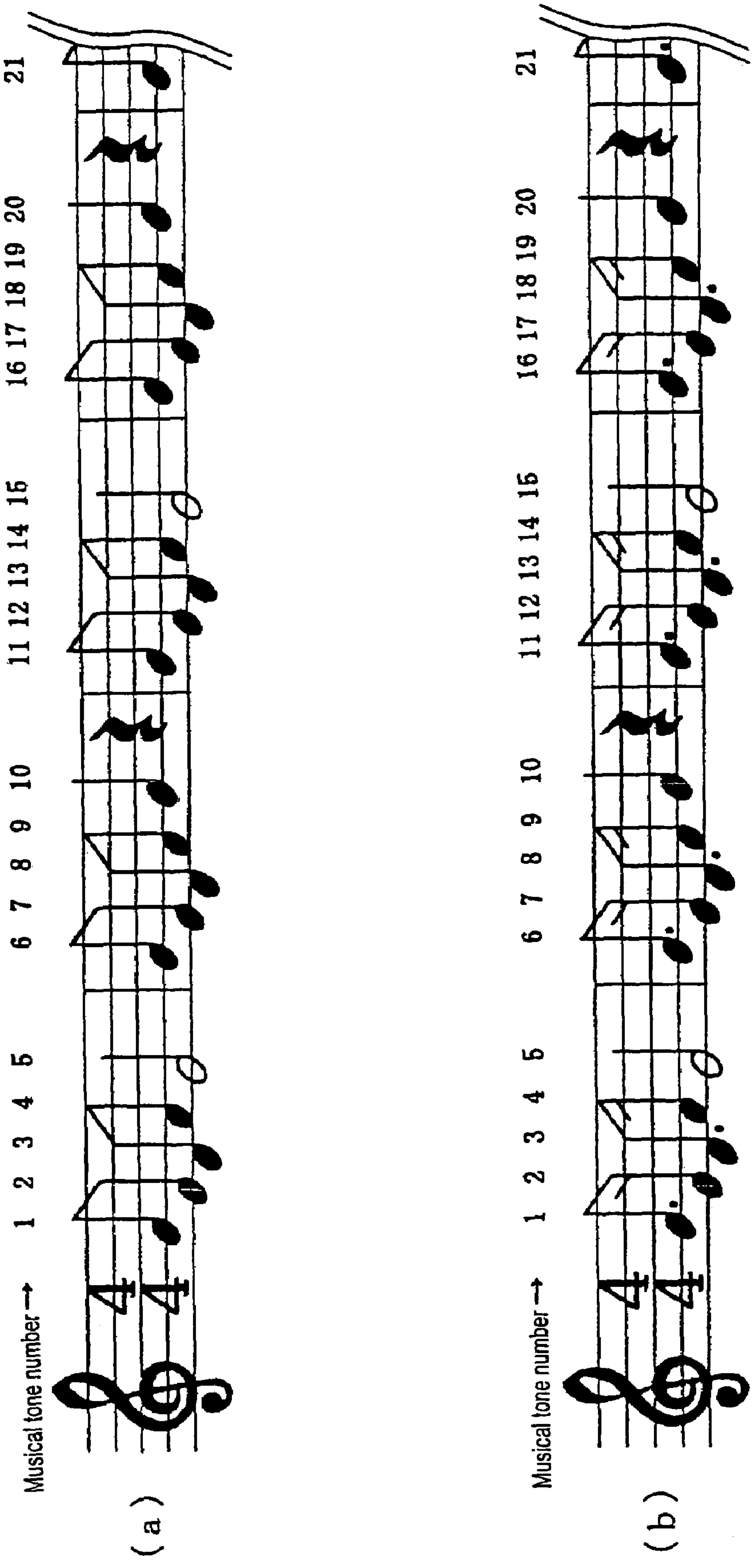
FIG. 10(*a*) shows performance data have been expressed by a musical score that expresses the original performance data according to an embodiment of the present invention.

FIG. 10 is the musical score data. FIG. 10(*a*) is the musical score data in accordance with the original composition and FIG. 10(*b*) is the musical score data that the user has made the target. In other words, In this preferred embodiment, the user carries out a performance in accordance with the musical score data that are shown in FIG. 10(*b*) for the waveform data that are in accordance with the musical score that is shown in FIG. 10(*a*).

FIG. 11 is the actual performance data. The performance data comprise each of the musical tone numbers with which the notes on are successively input, the note on input times ("Time") that are expressed in tick units, the note numbers ("Note No.") with which the notes on have been input, the time (in those cases where it is not a legato performance) from the note on to the note off or the time (in those cases where it is a legato performance) from the note on until the next note on ("Duration"), the velocity, and the like. In addition, the performance data are stored in a specified region in the RAM 16 and are stored successively with each input of a note on and the like. In this preferred embodiment, in order to make the understanding of the invention easier, the explanation is given for those cases where the performance data that are shown in FIG. 11 are input successively in conformance with the pitches that are shown in the musical score of FIG. 10 without any note number errors. In other words, the musical tone numbers of the notes in the musical score of FIG. 10 correspond to each of the respective musical tone numbers of FIG. 11.

FIG. 11(*a*) is the performance data in accordance with the musical score shown in FIG. 10(*a*) which are the original performance data that are stored in a specified storage region (for example, the RAM 16). The original performance data (FIG. 11(*a*)) are the performance data that the key pressing intervals (the difference between the time of the current key pressing (Time) and the time of the next key pressing) and the key pressing time periods (the difference between the key pressing time (in those cases where it is not a legato performance) or the difference between the time of the key pressing and the time of the next key pressing (in those cases where it is a legato performance), in other words, the value of the "Duration") correspond to theoretical notes of the musical score data that are shown in FIG. 10(*a*). In this preferred embodiment, the count for the ticks (the minimum time unit for expressing the time interval with an automatic performance system) that comprise the quarter notes, which are the unit notes (one beat) for four-four time, is "120." In addition, the tempo map is appended to the original performance data as the tempo information and, in this preferred embodiment, the performance tempo is "90" at the point in time of the start of the original performance data and the performance tempo is fixed at "90" after that.

First, a manual performance is carried out here of a performance that follows the musical score of FIG. 10(*b*) as the first performance for the planned performance data of the original performance data that conform to the original waveform data that are shown in FIG. 11(*a*). FIG. 11(*b*) is a drawing that shows the performance data of the first performance that have been stored in a specified storage region (for example, the RAM 16). Each of the key pressing intervals and note lengths that correspond to what is shown in the musical score in accordance with FIG. 11(*b*) are, for the most part, conformed to, however, since this is a manual performance, there is a tendency for the key pressing time periods (the sound production lengths), which are each of the waveform segments that correspond to the respective notes that are shown in the musical score, to become shorter than the lengths of those notes. It is understood that performance is done with the tick count of each bar (in the case of this example, the difference between the key pressing time of the musical tone of the beginning of each bar and the key pressing time of the musical tone of the beginning of the next bar) approximately "480" in all and the performance tempo virtually uniform at about "90." The performance tempo information is stored as a portion of the performance data that are shown in FIG. 11(*b*).

Next, FIG. 11(*c*) is a drawing that shows the performance data of the second performance that has been newly carried out following the first performance as the planned performance data for the first performance data that are shown in FIG. 11(*b*). With the first bar (musical tone numbers 1 through 5) and the second bar (musical tone numbers 6 through 10) in accordance with the performance shown in FIG. 11(*c*), a value of about "480" has been measured for the tick count of both bars. However, with the third bar (musical tone numbers 11 through 15), a value of "398" has been measured, showing that the tempo that was performed is faster than the original tempo of "90" for the entire third bar.

In the second preferred embodiment, in those cases where there has been a change in the tempo of the performance of the first performance or of the tempo using an operator and the like as the performance tempo at the time of the start of the performance, that changed tempo is set by the waveform generating device 1. Here, in those cases where there has been a change in the tempo using an operator and the like, the tempo map, which is the data with which the progress of the musical composition and the alterations in the tempo are described for the previous performance data that are stored in a specified storage region (such as the RAM 16 and the like), is updated by the amount of tempo alteration (the amount of increase or the amount of decrease) that is set. For the updating of the tempo map, the percentage of increase or the percentage of decrease in the tempo is multiplied by the tempo map or the amount of the increase or the amount of the decrease in the tempo is added. In other words, for the overall tempo map of the performance tempos, the updating is carried out by leaving the aspects of the shifts and alterations of the tempos that are contained in the tempo map as they are and moving the alteration lines for the tempos that are expressed by the tempo map up or down in parallel. At the time of the second performance of the performance contents that are the same as those of the first performance, each of the waveform segments of the waveform data is compressed or expanded based on the compression and expansion percentage for the performance data that has been stored for the first performance. In addition, by means of the tempo change processing (FIG. 12) that will be discussed later, when a new tempo for the first performance tempo is detected in the second performance tempo, the tempo map for the first performance data that has been stored before is updated at the point in time of the detection and the waveform data for each note (each segment) are compressed or expanded in conformance with the updated current tempo. Accordingly, the tempo alterations during the performance can be coped with.

FIG. 7(*b*) is a flowchart of the key pressing time interrupt processing routine of the second preferred embodiment that is executed by the CPU 10. The program of the key pressing time interrupt processing routine of the second preferred embodiment is, in the same manner as the program of the key pressing time interrupt processing routine of the first preferred embodiment (FIG. 7(*a*)), also launched by the pressing of a key of the keyboard 22 or by the inputting of key pressing information for the performance data. When the key pressing time interrupt processing routine is launched by the pressing of a key of the keyboard 22, the segment counter n advances "1" based on the new key pressing and the next waveform segment is designated (S101).

After the processing of S101, the tempo change processing (S108) is carried out. An explanation will be given here regarding the tempo change processing (S108) while referring to FIG. 12. FIG. 12 is a flowchart of the tempo change processing that is executed by the CPU 10. With the tempo change processing, first the note column memory is updated based on the note number of the key pressing (S301). The note column memory here is a memory that is not shown in the drawing which is comprised by the RAM 16 and is a memory in which the most recent ten note numbers in the order that they keys have been pressed are stored together with the respective key pressing times. In the processing of S301, in those cases where ten note numbers have already been stored in the note column memory, the note number that corresponds to the oldest key pressing time is deleted and the note number of the key that has currently been pressed and its key pressing time T2 is stored. The key pressing time is initialized whenever a performance is started from the top of the waveform data. The note column memory not only stores the note number and the key pressing time T2 but may also comprise information such as the key pressing time period (the Duration) and the like in the same manner as the performance data that are shown in FIG. 11 discussed above.

After the processing of S301, whether or not the current key pressing time T2 is at a point where a period of four or more beats has passed from the previous time T1 for which the tempo was calculated (refer to S305) is ascertained (S302). The time T1 for which the tempo has been updated in the processing of S305 is initialized to "0" each time the performance is started. In those cases where the result that has been ascertained is that the current key pressing time is not a point where a period of four or more beats has passed from the time T1 (the time at which the tempo was set previously), in other words, the time period (T2-T1) has not reached a time period that corresponds to four beats (S302: no), the tempo change processing ends.

On the other hand, if the result that has been ascertained by the processing of S302 is that the current key pressing time is a point where a period of four or more beats has passed from the calculation of the tempo by the processing of S305 (S302: yes), a matching assessment with respect to the previous performance data (the first performance data) is carried out (S303). After the processing of S303, a determination is made as to whether or not the note number in the current performance (the second performance data) of the key pressing during the time period (T2-T1) corresponds to one of the segments of four or more beats in the previous performance data (S304).

The matching assessment that is carried out by the processing of S303 is one that is already publicly known. For example, in Japanese Laid-Open Patent Application Publication (Kokai) Number Hei 9-292882, a method is cited as a portion of the automatic accompaniment control method in which the positions that match the data of the musical score for the plurality of pitches that are continuously input are searched for and the display based on the score is followed by means of the calculation of the tempos that correspond to the positions. In accordance with the matching method cited in Japanese Laid-Open Patent Application Publication (Kokai) Number Hei 9-292882, it is possible to carry out the matching between the performance data and the musical score while taking into consideration those cases where there has been an incorrect performance, those cases where a key has been pressed other than for the note that is entered in the musical score, those cases in which the key for a note that is entered in the musical score is intentionally not pressed, and the like.

In the processing of S304, in those cases where a determination has been made that a match cannot be made with the previous performance data (S304: no), the tempo change routine ends. On the other hand, in those cases where a determination has been made by the processing of S304 that a match could be made between the current performance data and one of the regions of four beats or more (in other words, the amount of one bar or more in this preferred embodiment) in the previous performance data (S304: yes), the tempo is calculated for the matched current performance data (S305).

In the processing of S305, the measured key pressing time period (units: ticks) of the amount of one bar or more (four beats or more) in the current performance data that has matched with the previous performance data is derived and the tempo is calculated based on the theoretical tick count for the number of ticks that are needed for the matching with the measured performance time period (for example, in this preferred embodiment, the theoretical tick count for the amount of four beats equals "480").

For example, in accordance with the current performance data (the second performance data) shown in FIG. 11(*c*), since the measured performance time period of the second bar (the musical tone numbers 6 through 10) is "479" (961-482), in the current performance, the second bar is calculated to have been performed at a tempo of "90.2" (90*480/479). The value of "90" is the performance tempo at the time of the previous performance (the first performance) in this preferred embodiment and in addition, the value that is stored in the specified storage region (such as the RAM 16 and the like) as the planned performance data for the previous performance data. In the processing of S305, when the calculation of the performance is executed, the current key pressing time T2 is set as T1.

When the tempo has been calculated by the processing of S305, next, whether or not the tempo that has been calculated at the time of the current performance is within the specified range that has been made the standard for the current tempo is ascertained (S306). In the processing of S306, a ratio is taken between the calculated tempo and the current tempo and whether or not the ratio (the calculated tempo/current tempo) is within a specified range is ascertained. In S306, for example, in this preferred embodiment, whether or not the calculated tempo is in a range of 0.5 to 0.9 times or 1.1 times to 1.5 times the current tempo, in other words, whether or not the tempo alteration in the current performance is within a specified range is ascertained, If the result that has been ascertained by the processing of S306 is that the tempo that has been calculated by the processing of S305 is not within a specified range (S306: no), the tempo change processing routine ends. On the other hand, in those cases where the result that has been ascertained by the processing of S306 is that the tempo that has been calculated by the processing of S305 is within a specified range (S306: yes), a determination is made that there has been a change in the performance tempo, the tempo map is updated based on the change in the performance tempo, the current performance tempo is updated (S307), and the performance tempo change processing (S108) ends.

In the processing of S307 here, the tempo map for the previous performance data that has been stored in a specified storage region (such as the RAM 16 and the like) is updated to the new tempo map from the current tempo by the amount of the performance tempo alteration (the amount of the increase or the amount of the decrease) and the current performance tempo is updated. The "update the tempo of the performance data" means that the percentage of the increase or the percentage of the decrease is multiplied by the tempo map for the performance data, or the amount of the increase or the amount of the decrease is added. In other words, for the tempo map of the entire performance data, the alteration lines for the tempos that are expressed by the tempo map are moved up or down in parallel and leaving the aspects of the shifts and alterations of the tempos that are contained in the tempo map as they are. In addition, the updating of the tempo map for the performance data is carried out by controlling the period of the clock signal generating circuit (not shown in the drawing) such that a tick is generated that corresponds to the tempo map that has been updated as described above.

In this preferred embodiment, the tempos of the first bar (musical tone numbers 1 through 5) and the second bar (musical tone numbers 6 through 10) at the time of the second performance are calculated to be "90" and "90.2" respectively by the processing of S305. Therefore, a determination is made by means of the processing of S306 that there has been no variation in the tempos for the first bar and the second bar.

On the other hand, the tempo of the third bar (musical tone numbers 11 through 15) at the time of the second performance is calculated to be "109" by means of the processing of S305 (refer to FIG. 11(*c*)). Since this tempo is "1.2" times the first performance tempo, a determination is made in the processing of S306 that the tempo has varied. Then, the portion from the fourth bar on (musical tone numbers 16 and over) is updated in the tempo map for the planned performance data that have been stored in the previous performance. The performance tempo is changed to the new tempo of "109" that has been calculated by the processing of S305, and the waveform data are compressed based on the new tempo.

Since the compression is done such that there is synchronization with the tempo of "109" for the waveform data of the fourth bar, the tick count of the fourth bar (musical tone numbers 16 through 20), which has been performed at a tempo that has not changed from the tempo of the third bar, is measured as "479," which is a small error with respect to the theoretical tick count of four beats. Accordingly, since for the third bar, which has become a performance tempo during the second performance that is different from that of the first performance, the error between the new tempo and the first performance data is great, a sound is produced for which there is a feeling of disorder but because the performance tempo for the fourth bar is changed by the processing of S307 and the time compression and expansion percentage information is corrected based on that tempo, the feeling of discord for the musical tones of the fourth bar almost disappears.

The explanation will return to FIG. 7(*b*). After the completion of the tempo change processing (S108), the time compression and expansion percentage information for the setting of the segment that corresponds to the segment counter n is calculated based on the current tempo that has been changed in the processing of S108 (S109). The time compression and expansion information that has been calculated by the processing of S109, and the pitch information and velocity value that are input by the keyboard 22 are output to the DSP 20, and an instruction is issued to the DSP 20 to start the sound production (S103).

The time compression and expansion percentage information that corresponds to the current tempo is acquired by the processing of S109 and S102 through S103, the new time compression and expansion percentage information is output to the DSP, and the sound production that corresponds to the new time compression and expansion percentage information is started.

After the processing of S103, whether or not the segment counter n is "1" is ascertained (S104). If the segment counter n is "1" (S104: yes), the key pressing time interrupt processing routine ends and the processing returns to the main processing routine (not shown in the drawing) of the waveform generating device 1.

On the other hand, if the result that has been ascertained by the processing of S104 is that the segment counter n is not "1" (S104: no), whether or not it is a legato performance is ascertained (S105). If the result that has been ascertained in the processing of S105 is that it is not a legato performance (S105: no), the key pressing time interrupt processing routine ends and the processing returns to the main processing routine (not shown in the drawing) of the waveform generating device 1.

On the other hand, if the result that has been ascertained by the processing of S105 is that it is a legato performance (S105: yes), the time from the previous key pressing to the current key pressing is derived, the time compression and expansion percentage information is computed, and the time compression and expansion percentage information that has been obtained by the computation as well as the performance data that include the tempo map that is related to the current performance are stored in a specified storage region (for example, the RAM 16) (S106). The new time compression and expansion percentage information that has been computed in the processing of S106 here is the time compression and expansion percentage information that is referred to at the time of the reproduction of the waveform data for each note at the time of the next performance. After the processing of S106, the sounds of the waveform segment for which sound production has been done due to the previous key pressing are canceled (S107), the key pressing time interrupt processing routine ends, and the processing returns to the main processing routine of the waveform generating device 1.

In the second preferred embodiment, in those cases where a key releasing has been ascertained, the key releasing time interrupt processing routine of FIG. 8 is launched in the same manner as in the first preferred embodiment and the processing is executed in accordance with the key releasing time interrupt processing routine. The new time compression and expansion percentage information that is computed in the processing of S203 in the key releasing time interrupt processing routine here is the time compression and expansion percentage information that is referred to at the time of the reproduction of the waveform data for each note (each segment) at the time of the next performance.

In the second preferred embodiment described above, after the second performance data have been calculated by the processing of S305 based on the measured time of the musical tones for the amount of four beats or the amount of a beat count greater than that which has been obtained from the matching, whether or not the tempo value is within a specified range is ascertained by the processing of S306. However, rather than deriving the second performance tempo, whether or not the ratio of the tick count that corresponds to the measured time of the musical tones for the amount of four beats or the amount of a beat count greater than that which has been obtained from the matching and the theoretical tick count that corresponds to the amount of the beat count is within a specified range may also be ascertained.

In addition, with the processing of S303 of the tempo change processing in the second preferred embodiment described above (FIG. 12), it is has been configured such that the matching determination is made between the performance data in the current performance and the previous performance data; however, the object of the matching is not limited to the previous performance data and it may also be set up such that the object is the past performance data in general such as the performance data from the time before last and the like. In addition, the object of the matching is not limited to the performance data of the same musical composition and it may also be set up such that the object is made the performance data of a different musical composition. Also, in this case, the data that are made the object of the matching are not limited to those that have been stored in a storage means that is furnished in the waveform generating device 1 (for example, the RAM 16) and may also be another storage medium that exists on a network.

In addition, in the second preferred embodiment described above, the explanation was given with the tempo of the first performance made a uniform "90" in order to make the invention easy to understand. However, the performance data may also be such that performance segments having various tempos are included.

As discussed above, in the second preferred embodiment of the waveform generating device 1 of the present invention, together with detecting in the middle of second performance the match that has been made of the performance data in a specified segment after the passage of the time of a specified segment (the amount of four beats (one bar) in the second preferred embodiment described above) with the performance at a tempo that differs from that of the first performance, if it has been ascertained that the alteration to a new tempo is an alteration that is within a specified range, the tempo map of the previous performance data that has been stored is updated so that it conforms to the new tempo and the time compression and expansion percentage information that is based on the new tempo is acquired. Accordingly, from the point in time that the tempo map is updated, waveforms are produced that have been synchronized with the new tempo based on the time compression and expansion percentage information that has been acquired from the new tempo. By this means, the alterations in the tempo in the middle of the performance can be conformed to and it is possible to reduce the feeling of discord imparted to the user.

Next, an explanation will be given of a third preferred embodiment of the waveform generating device 1 of the present invention while referring to FIG. 13. In the first and second preferred embodiments described above, the sound production lengths of each of the sound production segments (the waveform segments) of the original waveform data are compressed and expanded on the time axis. In contrast to this, in the third preferred embodiment, the pitches of the original waveform data that are varied are varied based on the pitches that are instructed. In other words, in the third preferred embodiment, an explanation is given for a waveform generating device 1 that can cope with a performance method in which the pitches of the sounds produced are gradually varied, called a musical portamento or slur. Incidentally, the portions that are the same as those in the previously mentioned first and second preferred embodiments have been assigned the identical keys and their explanation will be omitted.

Figure 13:
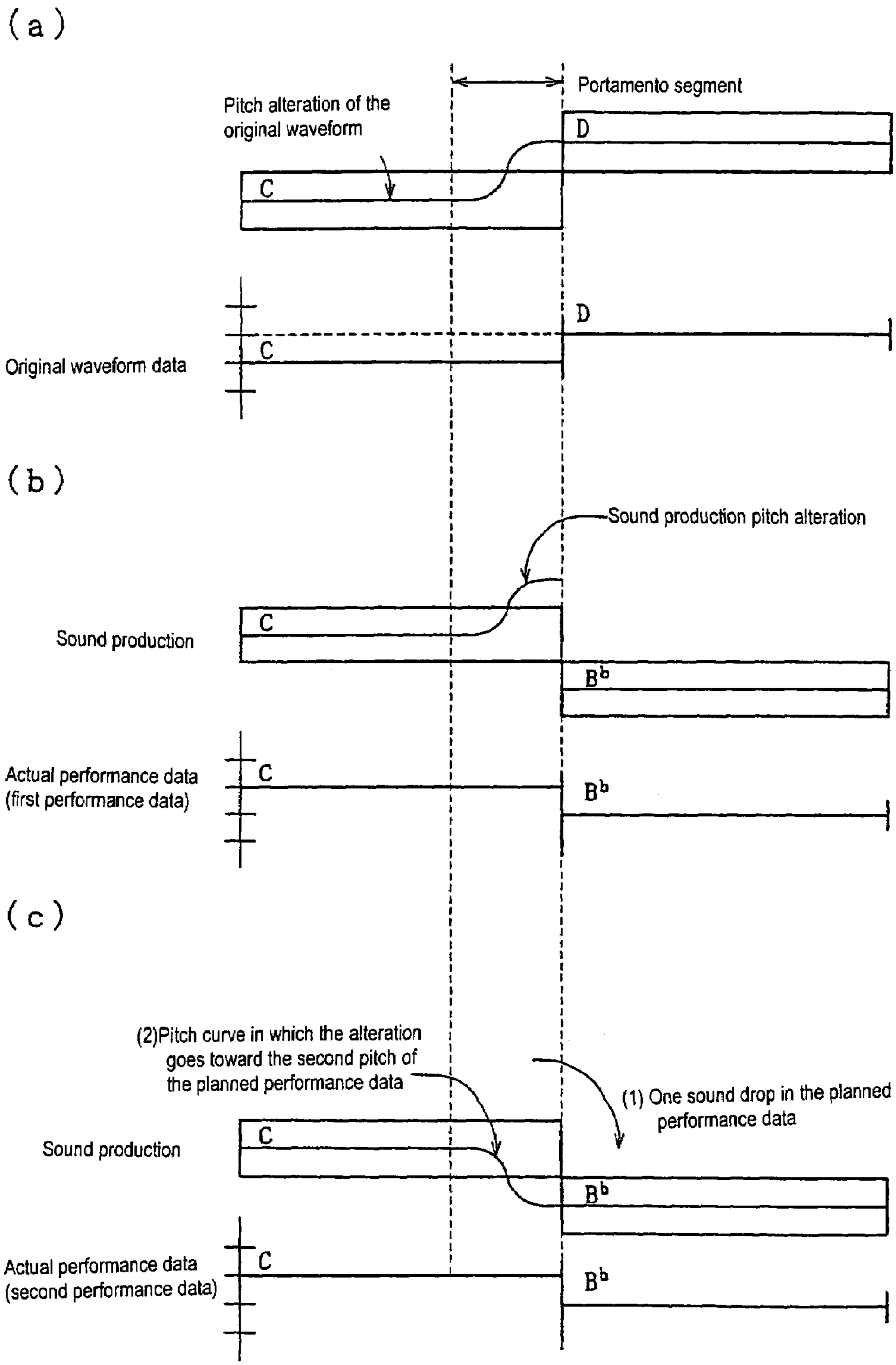
FIG. 13(*a*) shows schematically the aspects of the pitch alteration of the original waveform data according to an embodiment of the present invention.

FIG. 13 is a drawing for the explanation of the portamento (or slur) pitch alteration in those cases where the pitch alterations of the original waveform data are processed such that the transitions are smooth. FIG. 13(*a*) is a drawing that shows schematically the aspects of the pitch alteration of the original waveform data. In the case where the pitch goes from the standard pitch "C" of the first waveform segment to the standard pitch "D" of the second waveform segment, the aspect in which the standard pitch goes from "C" toward "D" in the portamento segment of the first waveform segment and the pitch gradually becomes high is shown.

The "standard pitch" here means the pitch that is representative of the segment. In those cases where the sound production has been instructed at a certain pitch for a certain segment, in the segment for which sound production has been instructed, the sound production at the pitch for which sound production has been instructed is carried out while the natural pitch vibrations that are originally contained in the segment remain.

FIG. 13(*b*) is a drawing that shows the pitch alterations in those cases where the first performance for the original waveform data that are shown in FIG. 13(*a*) has been carried out by the key pressing or key releasing operation of the keyboard 22. As is shown in FIG. 13(*b*), in the first performance of this preferred embodiment, the keys for "C" for the first segment and "B♭" for the second segment are pressed for the original waveform data that express a portamento performance in which the standard pitch goes from "C" to "D." In this case, by pressing the key for "C, " the sound production at the pitch of "C " is started in the first waveform segment and the pitch is gradually varied toward "D " in the portamento segment. However, the sound production at the pitch of "B♭" is started in the second waveform segment by the pressing of the key for "B♭. " Accordingly, the first performance comes to impart an extraordinarily unnatural feeling.

FIG. 13(*c*) is a drawing that shows the pitch alteration in those cases where the second performance has been carried out while referring to the planned performance data based on the first performance data. As is in shown in FIG. 13(*c*), in the second performance, a performance that is the same as the first performance is carried out and the pitch alteration of the portamento segment is corrected by the first performance data that have been stored as the planned performance data. In other words, since a "B♭" is designated (key pressing) following the C in the planned performance data, in the second performance, the portamento segment of the first waveform segment is controlled so as to gradually vary the pitch from "C" to "B♭." Accordingly, in the second performance, it is possible to carry out a natural portamento performance.

As discussed above, in the third preferred embodiment of the waveform generating device 1 of the present invention, the pitch information is acquired for each waveform segment in the original waveform data based on the first performance. If the first performance is the performance that is made the target, since the sound production at the time of the second performance is produced in conformance with the pitch information that has been acquired based on the first performance, it is possible to avoid an unnaturalness in the pitch alteration of each of the waveform segments at the time of a portamento (or slur) performance.

Next, an explanation will be given regarding a fourth preferred embodiment of the waveform generating device 1 of the present invention while referring to FIG. 14 and FIG. 15. In the third preferred embodiment described above, the pitches of the original waveform data that were varied were varied based on the instructed pitches. In contrast to this, in the fourth preferred embodiment, the volumes of the original waveform data that are varied are varied based on the instructed volumes. The portions that are the same as those in the previously mentioned third preferred embodiment have been assigned the identical keys and their explanation will be omitted.

Figure 14:
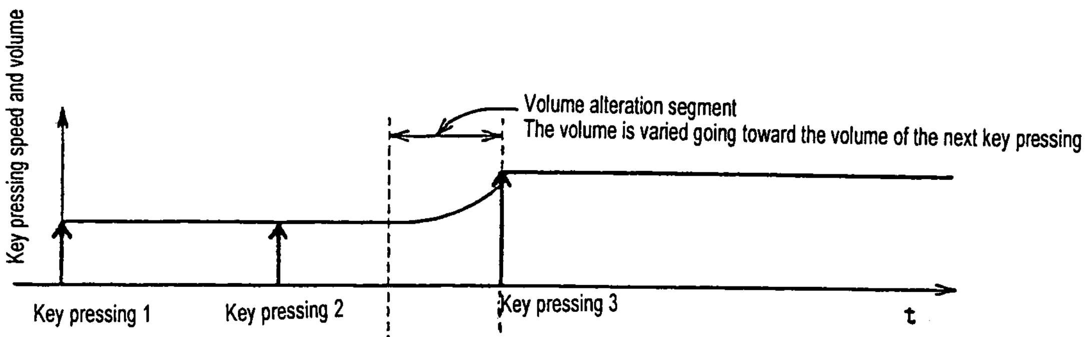
FIG. 14(*a*) shows schematically the aspects of the volume alteration of the original waveform data according to an embodiment of the present invention.
Figure 14:
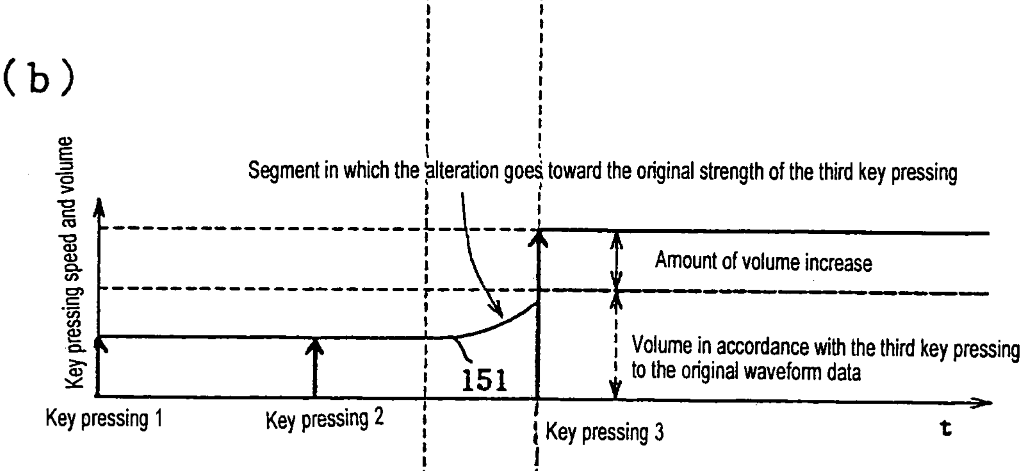
Figure 14:
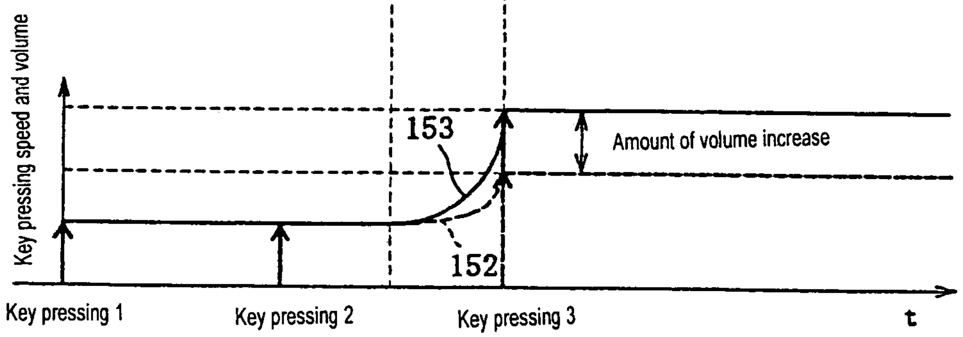

FIG. 14 is a drawing for the explanation of the volume alteration in those cases where a portamento performance (or a slur performance) has been carried out with a sustained sound series of musical tones. FIG. 14(*a*) is a drawing that shows schematically the aspects of the original waveform data volume alterations. In addition, FIG. 14 is a drawing that shows the matching between the original waveform data and the performance data that correspond to each of the waveform segments of the original waveform data. For the key pressing 1 that corresponds to the sound production of the first waveform segment and the key pressing 2 that corresponds to the sound production of the second waveform segment, each of the key pressing speeds, which instruct the volume of the performance data, is made nearly the same. The latter half of the second waveform segment, the segment in which the volume is gradually varied is passed through and the volume of the third waveform segment is attained. Accordingly, the key pressing speed of the key pressing 3 that corresponds to the third waveform segment becomes stronger (faster) than the first or second key pressing speed.

FIG. 14(*b*) is a drawing that shows the volume alteration in those cases where the first performance has been carried out for the original waveform data and the original performance data that are shown in FIG. 14(*a*) by the key pressing or key releasing operation of the keyboard 22. As is shown in FIG. 14(*b*), in the first performance of this preferred embodiment, for the key pressing 1 and the key pressing 2, the key pressing has been done at a speed that is equivalent to the original performance data but for the key pressing 3, the key pressing has been done stronger (faster) than the key pressing speed of the original data. In this case, in the first waveform segment and the second waveform segment, the sound production is started at nearly the same volume as the original waveform data and in the volume alteration segment, the volume alteration is carried out in conformance with the volume alteration of the volume alteration segment of the original performance data. In other words, the volume alteration is carried out going gradually toward the volume that conforms to the key pressing speed of the key pressing 3 of the original performance data (the solid line 151). In the first performance here, when the key pressing 3 is at a key pressing speed that is stronger (faster) than the key pressing 3 of the original waveform data, since the sound production for the third waveform segment is at a volume that corresponds to that key pressing 3, the performance becomes one that imparts an extraordinarily unnatural feeling.

FIG. 14(*c*) is a drawing that shows the volume alteration in those cases where the second performance has been carried out while referring to the planned performance data based on the first performance data. As is shown in FIG. 14(*c*), in the second performance having the same contents as the first performance, the volume alteration for the volume alteration segment is corrected from the broken line 152 to the solid line 153 based on the planned performance data that have been stored from the first performance data. In other words, at the time of the second performance, the control is done by means of the planned performance data that include the key pressing speed information for the key pressing 3 such that there is a gradual alteration from the volume that corresponds to the key pressing 2 to the volume that corresponds to the following key pressing 3. Accordingly, in the second performance, it is possible to carry out a performance in which the volume alteration is done naturally.

Figure 15:
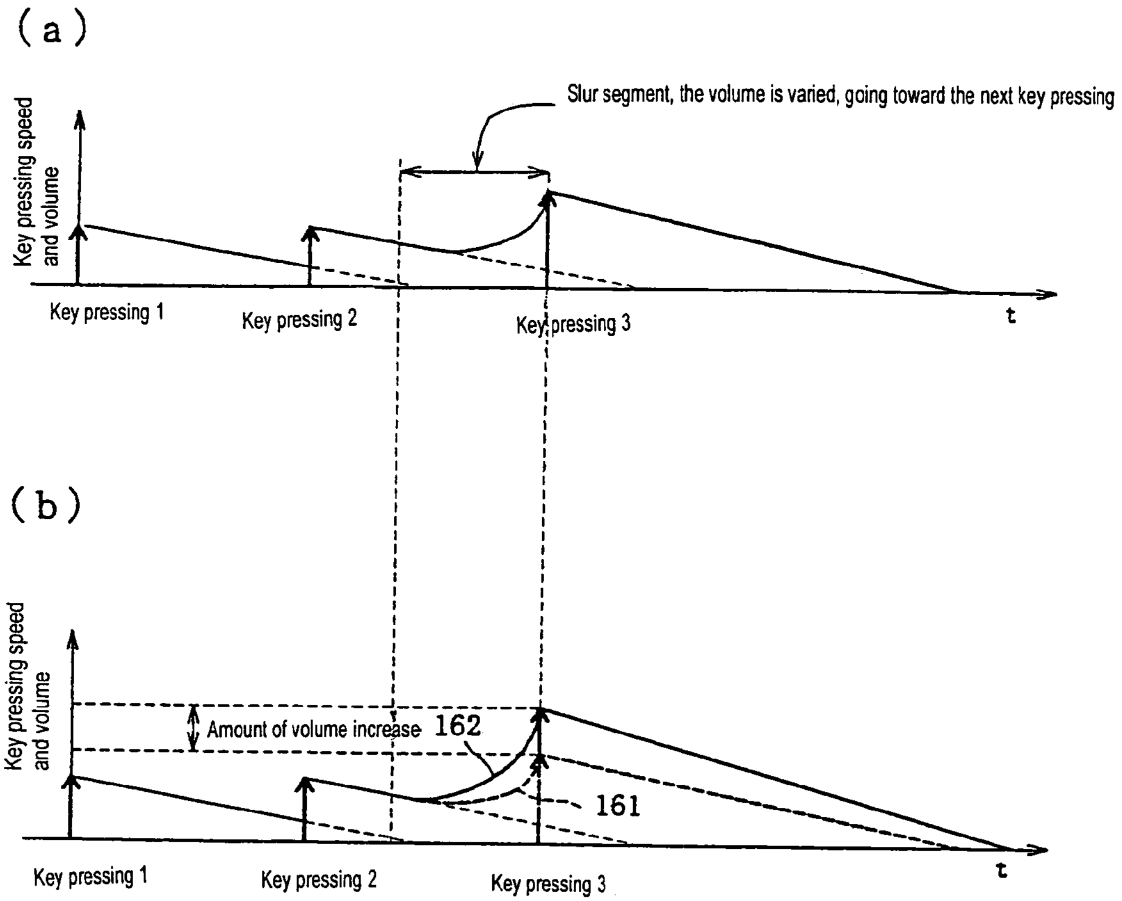
FIG. 15(*a*) shows schematically the aspects of the volume alteration of the original waveform data according to an embodiment of the present invention.

In addition, FIG. 15 is a drawing for the explanation of the volume alteration in those cases where a portamento performance (or a slur performance) has been carried out with a decaying sound series of musical tones. FIG. 15(*a*) is a drawing that shows schematically the aspects of the original waveform data volume alterations. In accordance with FIG. 15(*a*), from the latter half of the second waveform segment, which is a slur segment, the segment in which the volume is gradually varied is passed through and the volume becomes the volume of the third waveform segment. Accordingly, the key pressing speed of the key pressing 3 that corresponds to the third waveform segment becomes stronger (faster) than the first or second key pressing speed.

FIG. 15(*b*) is a drawing that shows the case in which the volume alteration of the slur segment has been carried out based on the planned performance data. Since in the first performance, key pressing 3 was done stronger (faster) than the key pressing speed for the key pressing 3 in the original performance data, in the same manner as in the case of the sustained sound series (FIG. 14(*b*)), the volume alteration becomes an alteration that goes from the volume of the second waveform segment to the volume of the key pressing 3 of the original performance data (the broken line 161) and, because of this, the performance becomes one that imparts an unnatural feeling. However, in the second performance, as is shown in FIG. 15(*b*), the volume alteration from the key pressing 2 to the key pressing 3 is corrected based on the planned performance data that have been stored from the first performance such that the broken line 161 that conforms to the original waveform data becomes the solid line 162. Accordingly, in the second performance, it is possible to carry out a performance in which the volume alteration is done naturally.

As discussed above, in the fourth preferred embodiment of the waveform generating device 1 of the present invention, the volume information based on the first performance is acquired for each waveform segment in the original waveform data. If the first performance is made the performance that is the target, since the sound production of the second performance will be made sound production that conforms to the volume information that has been acquired based on the first performance, it is possible to avoid an unnaturalness in the volume alteration of each of the segments during a portamento (or a slur) performance.

The processing of S106 in the key pressing time interrupt processing routine (FIG. 7(*a*) and FIG. 7(*b*)) and the processing of S203 in the key releasing time interrupt processing routine (FIG. 8) are applicable as a performance data detection means, and the processing of S307 in the tempo change processing (FIG. 12) is applicable as a performance data updating means. In addition, the processing of S305 in the tempo change processing (FIG. 12) is applicable as a tempo detection means.

An explanation was given above of the present invention based on preferred embodiments, however, the present invention is one that is in no way limited to the preferred embodiments described above and the fact that various modifications and changes are possible that do not deviate from and are within the scope of the essentials of the present invention can be easily surmised.

For example, in the preferred embodiments described above, the waveform generating device 1 is configured such that the time compression and expansion percentage information that is stored in the storage means (the RAM 16) is used. However, it may also be configured such that the time compression and expansion percentage information is calculated from the time information for each key pressing (note on) and each key releasing (note off) that is stored in the storage means and used.

In addition, in the preferred embodiments described above, each waveform segment was compressed or expanded on the time axis and reproduced based on the length of the sound production from the key pressing to the key releasing except at the time of legato playing. However, it may also be configured such that each waveform segment is always compressed or expanded and reproduced based on the length of the time period from the key pressing to the next key pressing.

In addition, in the preferred embodiments described above, in order to simplify the explanation and make it easier to understand, an explanation regarding a detailed configuration of a chain of waveform data of a plurality of separated sound components was omitted. The "chain of waveform data of a plurality of separated sound components" is, for example, waveform data that are stored in a storage means for which a readout designation is possible in each storage unit. In this case, it can be configured such that mark information for delimiting each sound component of the waveform data is appended. Or else, by dividing the waveform data in a plurality of storage units with which a readout designation is possible in each storage unit into sound components and storing each of them, it may be configured without appending mark information for delimiting the segments. Furthermore, these sound components stored in each storage unit can be read out successively in any order to compose a series of musical tones.

In addition, in the second preferred embodiment described above, it was configured such that matching is carried out for a performance of four beats or more and the tempo is calculated in the case where matching of a performance segment that exceeds the amount of one bar is done. However, instead of this, it may be configured such that matching is carried out for each key pressing and the tempo calculated based on the time that has passed from the time that the previous matching was acquired for each matching that is done. Also, in the second preferred embodiment described above, it was configured such that the tempo alterations are detected for the amount of one bar that corresponds to the bar line interval in the musical score. However, it may also be configured such that the tempo alterations are detected for the amount of one bar from any timing desired.

In addition, in the second preferred embodiment described above, it has been configured such that if the tempo that is calculated for each matching that is done for a performance segment that exceeds one bar (four beats) is within a specified range, the tempo map of the planned performance data is updated. However, instead of this, it may be configured such that the tempos that are calculated for each series of a plurality of notes or bars (or a unit length instead of a bar) are averaged and, in those cases where the value is within a specified range, the tempo map of the planned performance data is updated.

In addition, in the second preferred embodiment described above, it has been configured such that the tempo is calculated for each matching that is done for a performance segment that exceeds one bar (four beats) and the tempo map of the planned performance data is updated using that value as it is. However, instead of this, it may be configured such that the filtering processing is carried out for each tempo that is calculated. By this means, it is possible for the tempo alterations during the minimum range for which matching is done (in the preferred embodiments described above, this is a bar) to be made smooth.

In addition, it has been configured such that in those cases where the tempo that has been calculated exceeds a specified range and the variation is great, the tempo map is not updated. However, it may be configured such that in those cases where that kind of large tempo alteration has continued for several bars (or several unit lengths instead of a bar), the tempo map is updated. Or else, it has been configured such that if the tempo that is calculated at the time that the matching is done for a performance segment that exceeds one bar is within a specified range, the tempo map of the planned performance data is updated with the tempo that has been calculated. However, in those cases where the tempo map is updated, it may be set up such that the calculated tempo becomes the final tempo and the tempo map is updated such that the tempo is varied gradually going toward the final tempo from the current tempo.

In addition, in the second preferred embodiment described above, it has been configured such that the tempo map is updated by the parallel shifting up and down of the alteration lines of the tempos that are expressed by the tempo map. Instead of this, rather than just the parallel shifting up and down of the alteration lines of the tempos that are expressed by the tempo map, it may be configured such that in a region in which a specified first threshold value is exceeded for the alteration line of the tempo after the parallel shift, the alteration line of the tempo after the parallel shift is corrected such that the difference between the maximum value and the minimum value of the alteration line of the tempo after the parallel shift is increased (or decreased) or, on the other hand, such that the alteration line of the tempo after the parallel shift is corrected such that the difference between the maximum value and the minimum value of the alteration line of the tempo after the parallel shift is increased (or decreased) even in a region that is less than a specified second threshold value (the second threshold value is less than the first threshold value).

In addition, in the second preferred embodiment described above, it may be configured such that the tempo value is determined at the point in time that the performance is started by the tap tempo operation prior to the start of the performance.

In addition, in the second preferred embodiment described above, it may be configured such that after the instruction for the start of the performance (the second performance) in an automatic performance based on the first performance data, the tempo is obtained by means of the tap tempo operation and that tempo alteration is detected.

In addition, in the preferred embodiments described above, it has been configured such that the performance is done matching the key that corresponds to the pitch in the keyboard 22 to the rhythm of the musical composition. However, it may be configured such that when any of the keys among those of the keyboard 22 is pressed matching the rhythm of the musical composition, the next sound production state is scheduled and the sound production is done for each of the waveform segments that corresponds to the pitch information of the planned performance data that has been stored. In this case, in the same manner as the preferred embodiment described above, it may be configured such that the each of the waveform segments of the waveform data is compressed or expanded and the sound production lengths of the sound production segments are varied or such that the volumes are varied in conformance with each of the respective key pressing times and key pressing strengths of the keyboard 22 or of their combinations. Furthermore, it may be configured such that, in those cases where the key pressing is done such that the tempos of the musical composition are varied, the compression and expansion of the waveform data is carried out in conformance with the tempo alterations.

In addition, in the preferred embodiments described above, it has been configured such that the waveform data that have been divided into a plurality of segments are reproduced and the sound production is done by a completely manual performance based on the planned performance data or are reproduced by means of an automatic performance with the planned performance data as they are, unchanged. However, it may be configured such that by the operation of an operator and the like by the user, any performance method desired is selected from a plurality of performance methods such as a completely manual performance, a performance in which only the rhythm is input by any of the keys as described above, a performance in which, in the same manner, only the tempo is input by a tap tempo during the performance as described above, and an automatic performance and the like, and switching can be done as desired.

In addition, in the second preferred embodiment described above, it may be configured such that the tempo control is in conformance with the strength or volume of the key pressing.

In addition, in the second preferred embodiment described above, it may be configured such that when the temporal ratio of the former half beat and the latter half beat of one beat is observed in a range that exceeds a specified segment and the temporal ratio that has been observed is determined to correspond to the swing ratio, the compression and expansion of the waveform data is done based in the planned performance data that have been updated in conformance with the current swing ratio.

In addition, it may be configured that a key type alteration such as a musical transposition and the like is done with the same technique as that of the second preferred embodiment described above.

In addition, it may be configured such that the first through the fourth preferred embodiments described above and the above mentioned modification examples are suitably combined.

While particular embodiments of the present invention have been shown and described, it will be obvious to those skilled in the art that the invention is not limited to the particular embodiments shown and described and that changes and modifications may be made without departing from the spirit and scope of the appended claims.

What is claimed is:

1. A waveform generating device comprising:

storage means for storing waveform data of a chain of a plurality of separated sound components;

performance data input means for inputting performance data;

time compression and expansion percentage acquisition means for acquiring a time compression and an expansion percentage of each of the separated sound components of the waveform data stored in the storage means based on a first series of the performance data; and waveform generation means for generating new waveform data by compressing and expanding the stored waveform data based on the time compression and the expansion percentage for each of the separated sound components in accordance with a second series of performance data that have been input by the performance data input means.

2. A waveform generating device according to claim 1, further comprising:

a second storage means for storing pitch information that corresponds to each of separated sound components of the first performance data that have been input by the performance data input means; and pitch information control means for changing a pitch information of the waveform data based on the pitch information stored in the second storage means in accordance with the second performance data that have been input by the performance data input means.

3. A waveform generating device according to claim 1, further comprising:

a second storage means for storing pitch information that corresponds to each of separated sound components of the first performance data that have been input by the performance data input means; and pitch information control means for changing a pitch of a separated sound component of waveform data based on the pitch information, wherein a pitch information of the waveform data in the separated sound component is gradually altered in accordance with the second performance data that have been input by the performance data input means.

4. The waveform generating device according to claim 1, wherein the first series of the performance data comprises a plurality of separated sound components corresponding to the separated sound components of the waveform data, and wherein the second series of the performance data comprises a plurality of separated sound components corresponding to the separated sound components of the waveform data.

5. The waveform generating device according to claim 1, wherein the second series of the performance data is input after the first series of the performance data is input.

6. A waveform generating device comprising:

storage means for storing waveform data of a chain of a plurality of separated sound components;

performance data input means for inputting performance data;

time compression and expansion percentage acquisition means for acquiring a time compression and an expansion percentage of each of the separated sound components of the waveform data stored in the storage means based on a first series of the performance data;

waveform generation means for generating new waveform data by compressing and expanding the stored waveform data based on the time compression and the expansion percentage for each of the separated sound components in accordance with a second series of performance data that have been input by the performance data input means;

second storage means for storing volume information that corresponds to each of separated sound components of the first performance data that have been input by the performance data input means; and volume information control means for changing a volume information of the waveform data based on the volume information stored in the second storage means in accordance with the second performance data that have been input by the performance data input means.

7. A waveform generating device comprising:

storage means for storing waveform data of a chain of a plurality of separated sound components;

performance data input means for inputting performance data;

time compression and expansion percentage acquisition means for acquiring a time compression and an expansion percentage of each of the separated sound components of the waveform data stored in the storage means based on a first series of the performance data;

waveform generation means for generating new waveform data by compressing and expanding the stored waveform data based on the time compression and the expansion percentage for each of the separated sound components in accordance with a second series of performance data that have been input by the performance data input means;

second storage means for storing volume information that corresponds to each of separated sound components of the first performance data that have been input by the performance data input means; and volume information control means for changing a volume information of a separated sound component of waveform data based on the volume information stored in the second storage means, wherein a volume information of the waveform data in the separated sound component is gradually altered in accordance with the second performance data that have been input by the performance data input means.

8. A method for generating a waveform comprising:

storing waveform data of a chain of a plurality of separated sound components;

inputting performance data;

acquiring a time compression and an expansion percentage of each of the separated sound components of the waveform data based on a first series of the performance data; and generating new waveform data by compressing and expanding the stored waveform data based on the time compression and the expansion percentage for each of the separated sound components in accordance with a second series of performance data that have been input.

9. A method as recited in claim 8, wherein storing waveform data comprises storing key pressing and key releasing time data for a plurality of keys of a keyboard.

10. A method as recited in claim 8, wherein storing waveform data comprises storing data corresponding to a time period from a key pressing time to a key releasing time for each key of a plurality of keys on a keyboard.

11. A method as recited in claim 8, wherein storing waveform data comprises storing, for each key of a plurality of keys on a keyboard, data corresponding to a time period from a pressing of the key to a pressing of a next key.

12. A method for generating a waveform comprising:

storing waveform data of a chain of a plurality of separated sound components;

inputting performance data;

storing first performance data that have been input;

detecting a sound production length of second performance data that have been input;

updating the first performance data based on the sound production length;

acquiring a time compression and an expansion percentage of each of the separated sound components of waveform data based on the first performance data that have been updated; and generating a waveform in conformance with the time compression and the expansion percentage and in, accordance with second performance data that are input.

13. A waveform generating device comprising:

a storage device for storing waveform data of a chain of a plurality of separated sound components;

a performance data input device for inputting performance data;

a time compression and expansion percentage acquiring device for acquiring a time compression and an expansion percentage of each of the separated sound components of the waveform data stored in the storage device based on a first series of the performance data; and a waveform generator for generating new waveform data by compressing and expanding the stored waveform data based on the time compression and the expansion percentage for each of the separated sound components in accordance with a second series of performance data that have been input by the performance data input device.

14. A device as recited in claim 13, wherein a storage device for storing waveform data comprises a storage device for storing key pressing and key releasing time data for a plurality of keys of a keyboard.

15. A device as recited in claim 13, wherein a storage device for storing waveform data comprises a storage device for storing data corresponding to a time period from a key pressing time to a key releasing time for each key of a plurality of keys on a keyboard.

16. A device as recited in claim 13, wherein a storage device for storing waveform data comprises a storage device for storing, for each key of a plurality of keys on a keyboard, data corresponding to a time period from a pressing of the key to a pressing of a next key.

17. A waveform generating device comprising:

a waveform data storage device for storing waveform data of a chain of a plurality of separated sound components;

a performance data input device for inputting performance data;

a performance data storage device for storing first performance data that have been input by the performance data input device;

a performance data detection device for detecting a sound production length of second performance data that have been input by the performance data input device;

a performance data updating device for updating the first performance data based on the sound production length;

a time compression and expansion percentage acquisition device for acquiring a time compression and an expansion percentage of each of the separated sound components of waveform data based on the first performance data that have been updated; and a waveform generator for generating a waveform in conformance with the time compression and the expansion percentage and in accordance with second performance data that are input by the performance data input device.

18. A method for generating a waveform comprising:

storing waveform data of a chain of a plurality of separated sound components;

inputting performance data;

acquiring a time compression and an expansion percentage of each of the separated sound components of the waveform data based on a first series of the performance data; and generating new waveform data by compressing and expanding the stored waveform data based on the time compression and the expansion percentage for each of the separated sound components in accordance with a second series of performance data that have been input, wherein each sound component corresponds to a single syllable of a word in a song.

19. A method for generating a waveform comprising:

storing waveform data of a chain of a plurality of separated sound components;

inputting performance data;

storing first performance data that have been input;

detecting a sound production length of second performance data that have been input;

updating the first performance data based on the sound production length;

acquiring a time compression and an expansion percentage of each of the separated sound components of waveform data based on the first performance data that have been updated; and generating a waveform in conformance with the time compression and the expansion percentage and in accordance with second performance data that are input, the method further comprising error processing for a condition in which the second performance data corresponds to a waveform segment that advances slower than the first performance data, by repeating a number of waveforms that are contained in a loop segment.

20. A method for generating a waveform comprising:

storing waveform data of a chain of a plurality of separated sound components;

inputting performance data;

storing first performance data that have been input;

detection a sound production length of second performance data that have been input;

updating the first performance data based on the sound production length;

acquiring a time compression and an expansion percentage of each of the separated sound components of waveform data based on the first performance data that have been updated; and generating a waveform in conformance with the time compression and the expansion percentage and in accordance with second performance data that are input, the method further comprising error processing for a condition in which the second performance data corresponds to a waveform segment that advances faster than the first performance data, by attenuating the generation of a waveform.

21. A waveform generating device comprising:

a storage device for storing waveform data of a chain of a plurality of separated sound components;

a performance data input device for inputting performance data;

a time compression and expansion percentage acquiring device for acquiring a time compression and an expansion percentage of each of the separated sound components of the waveform data stored in the storage device based on a first series of the performance data; and a waveform generator for generating new waveform data by compressing and expanding the stored waveform data based on the time compression and the expansion percentage for each of the separated sound components in accordance with a second series of performance data that have been input by the performance data input device, wherein each sound component corresponds to a single syllable of a word in a song.

22. A waveform generating device comprising:

a waveform data storage device for storing waveform data of a chain of a plurality of separated sound components;

a performance data input device for inputting performance data;

a performance data storage device for storing first performance data that have been input by the performance data input device;

a performance data detection device for detecting a sound production length of second performance data that have been input by the performance data input device;

a performance data updating device for updating the first performance data based on the sound production length;

a time compression and expansion percentage acquisition device for acquiring a time compression and an expansion percentage of each of the separated sound components of waveform data based on the first performance data that have been updated; and a waveform generator for generating a waveform in conformance with the time compression and the expansion percentage and in accordance with second performance data that are input by the performance data input device, wherein the waveform generator further comprising an error processing routine for a condition in which the second performance data corresponds to a waveform segment that advances slower than the first performance data, by repeating a number of waveforms that are contained in a loop segment.

23. A waveform generating device comprising:

a waveform data storage device for storing waveform data of a chain of a plurality of separated sound components;

a performance data input device for inputting performance data;

a performance data storage device for storing first performance data that have been input by the performance data input device;

a performance data detection device for detecting a sound production length of second performance data that have been input by the performance data input device;

a performance data updating device for updating the first performance data based on the sound production length;

a time compression and expansion percentage acquisition device for acquiring a time compression and an expansion percentage of each of the separated sound components of waveform data based on the first performance data that have been updated; and a waveform generator for generating a waveform in conformance with the time compression and the expansion percentage and in accordance with second performance data that are input by the performance data input device, wherein the waveform generator further comprises an error processing routine for a condition in which the second performance data corresponds to a waveform segment that advances faster than the first performance data, by attenuating the generation of a waveform.

* * * * *